(12) United States Patent
Li et al.

(10) Patent No.: US 10,879,355 B2
(45) Date of Patent: Dec. 29, 2020

(54) PROFILE DESIGN FOR IMPROVED DEVICE PERFORMANCE

(71) Applicant: Taiwan Semiconductor Manufacturing Company, Ltd., Hsinchu (TW)

(72) Inventors: Kun-Mu Li, Zhudong Township (TW); Yen-Ru Lee, Hsinchu (TW); Hsueh-Chang Sung, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/443,457

(22) Filed: Jun. 17, 2019

(65) Prior Publication Data
US 2020/0105875 A1    Apr. 2, 2020

Related U.S. Application Data

(60) Provisional application No. 62/737,573, filed on Sep. 27, 2018.

(51) Int. Cl.
| | |
|---|---|
| *H01L 29/08* | (2006.01) |
| *H01L 21/3065* | (2006.01) |
| *H01L 21/308* | (2006.01) |
| *H01L 29/66* | (2006.01) |
| *H01L 21/02* | (2006.01) |
| *H01L 29/45* | (2006.01) |
| *H01L 27/088* | (2006.01) |

(Continued)

(52) U.S. Cl.
CPC .... *H01L 29/0847* (2013.01); *H01L 21/02532* (2013.01); *H01L 21/3065* (2013.01); *H01L 21/3083* (2013.01); *H01L 21/823418* (2013.01); *H01L 21/823431* (2013.01); *H01L 21/823437* (2013.01); *H01L 21/823468* (2013.01); *H01L 21/823475* (2013.01); *H01L 27/0886* (2013.01); *H01L 29/45* (2013.01); *H01L 29/665* (2013.01); *H01L 29/6656* (2013.01); *H01L 29/66545* (2013.01); *H01L 29/7833* (2013.01)

(58) Field of Classification Search
CPC ............. H01L 29/785; H01L 29/0847; H01L 21/823425; H01L 21/02532; H01L 21/30604; H01L 27/0886
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |

(Continued)

*Primary Examiner* — Changhyun Yi
(74) *Attorney, Agent, or Firm* — Slater Matsil, LLP

(57) ABSTRACT

A semiconductor device, and a method of manufacturing, is provided. A first recess in the semiconductor layer may be disposed between a first dummy gate and a second dummy gate. A first spacer is formed on sidewalls of the first dummy gate and a second spacer is formed on sidewalls of the second dummy gate. The first and second spacers form triangular spacer extensions contacting the bottom surface of the first recess. After forming the first spacer and the second spacer, a second recess is formed in the semiconductor layer disposed between the first dummy gate and the second dummy gate. A source/drain region is epitaxially grown in the second recess.

20 Claims, 27 Drawing Sheets

(51) Int. Cl.
*H01L 21/8234* (2006.01)
*H01L 29/78* (2006.01)

(56) References Cited

U.S. PATENT DOCUMENTS

| | | |
|---|---|---|
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 2018/0366373 A1 | 12/2018 | Li et al. |
| 2019/0165145 A1* | 5/2019 | Ghani ................ H01L 29/7851 |

\* cited by examiner

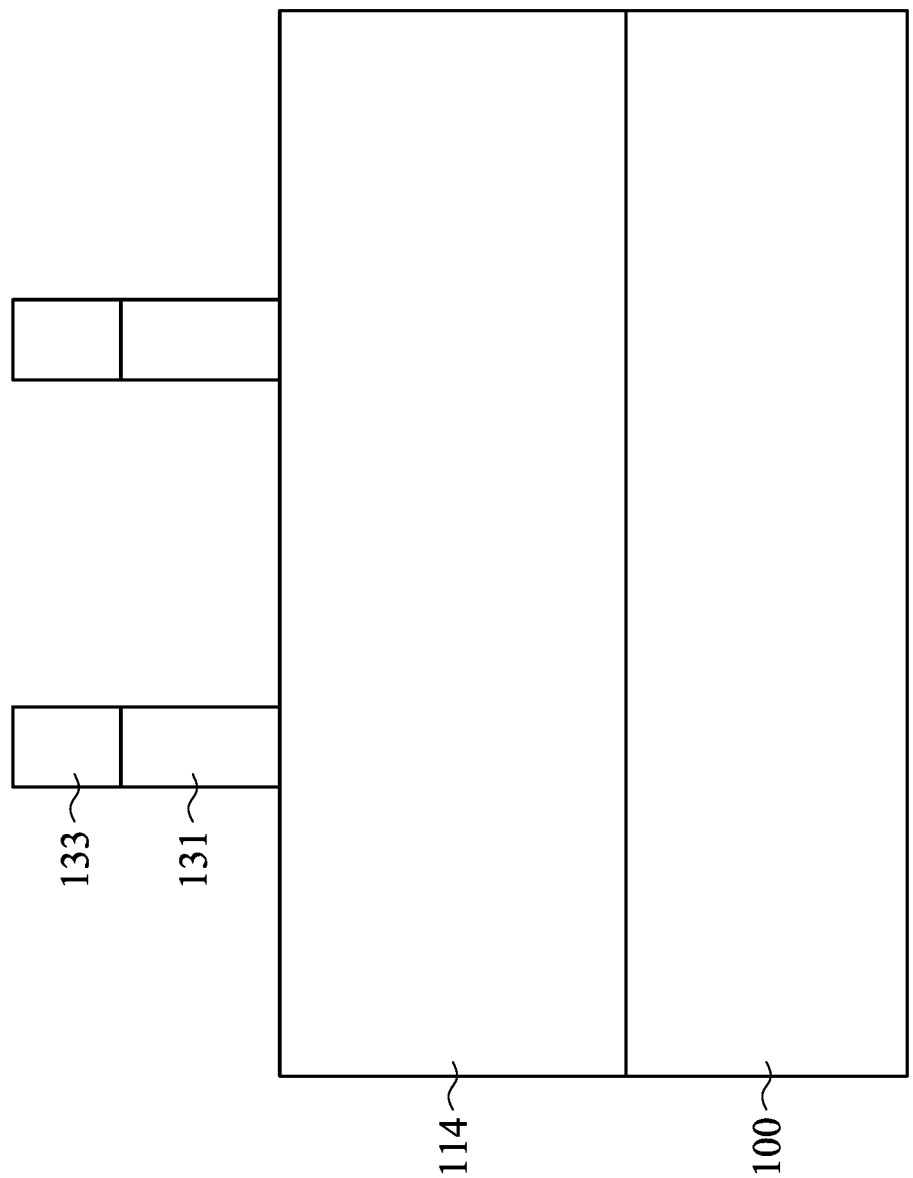

PROFILE DESIGN FOR IMPROVED DEVICE PERFORMANCE

PRIORITY CLAIM AND CROSS-REFERENCE

This application claims the benefit of U.S. Provisional Application No. 62/737,573, filed on Sep. 27, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

FinFETs are increasingly employed in the manufacture of integrated circuits, owing to the small size and high performance of the FinFET transistor. Fully strained channels further improve FinFET performance, but fully strained channel architecture creates its own shortcomings to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
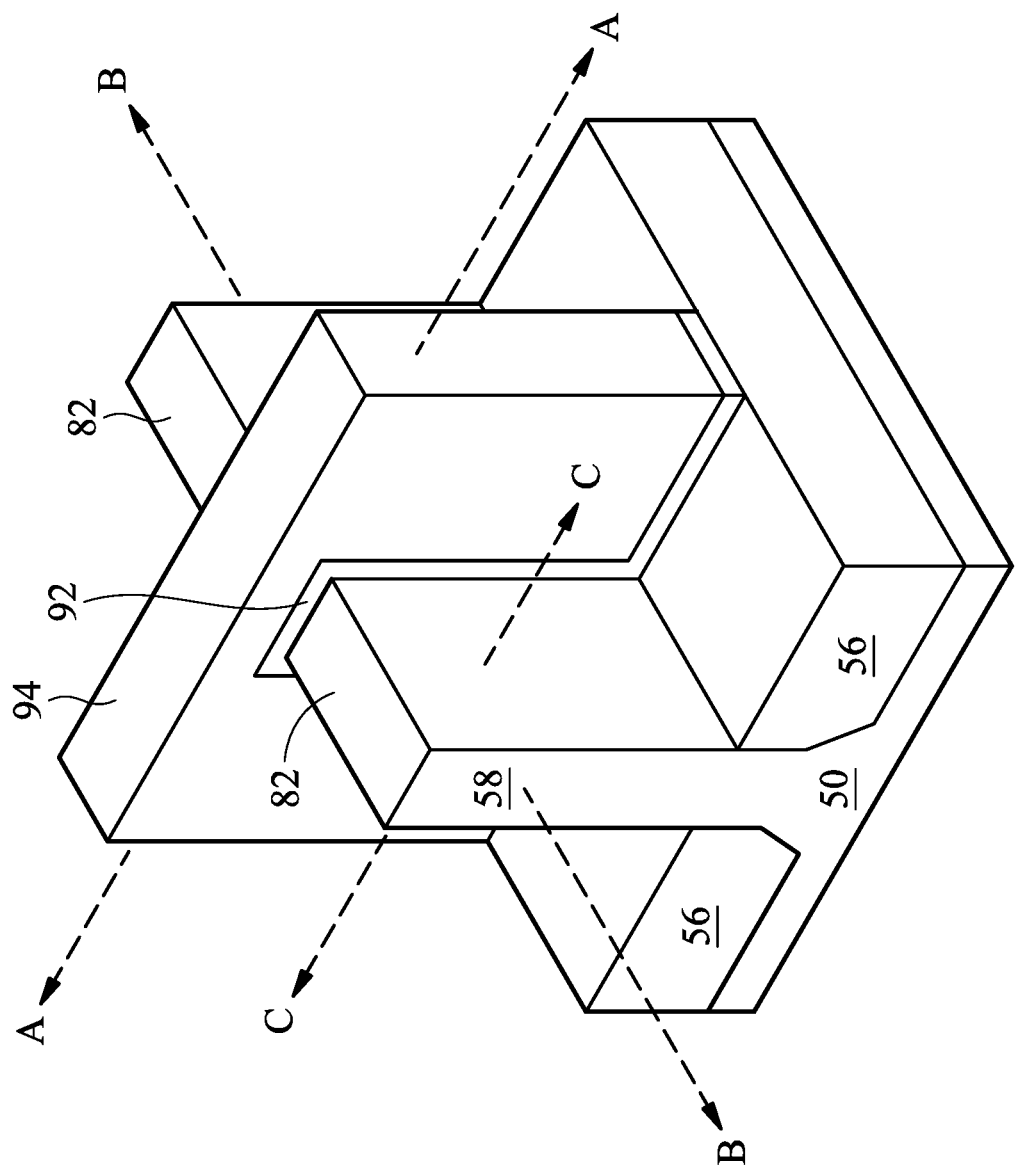
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While not a limitation of the present disclosure, it is contemplated that many embodiments will be directed toward the manufacture of a FinFET device. In such embodiments, the processes described below would be performed on respective fins. Various alternative and extensions to the teachings provided herein will be apparent to those skilled in the art, once informed by the present disclosure, and are within the contemplated scope of this disclosure. For instance, although the illustrated embodiments are directed toward a FinFET device, one skilled in the art will recognize applicability of the above teaching to, e.g., planar transistors, MEMS devices, 3D IC devices and the like.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Advantageous features of one or more embodiments disclosed herein include faster device performance from lower source/drain capacitance as well as better yield and product reliability due to spacer extensions with a triangular profile acting as an out-diffusion metal blocking layer. In order to improve reliability, mobile chips require lower power consumption, which is dependent on reducing source/drain area parasitic capacitance. Unlike conventional structures wherein the low thermal stability of an interface between contact metal to source/drain epi may cause low yield and poor reliability, embodiments disclosed herein provide for improved yield and reliability. A further advantageous feature of at least some embodiments described and/or illustrated herein includes lower capacitance and improved yield and stability resulting from a channel profile underneath the spacer. The process is compatible with the standard integrated flow fabrication without other loop processes being changed. At least some of the embodiments described herein can be extended to other processes using epitaxial technology which requires shape change, such as MEMS devices, 3D IC devices and the like.

FIG. 1 illustrates an example of a FinFET in a three-dimensional view for reference, in accordance with some embodiments. The FinFET comprises a fin 58 on a substrate 50 (e.g., a semiconductor substrate). Isolation regions 56 are disposed in the substrate 50, and the fin 58 protrudes above and from between neighboring isolation regions 56. Although the isolation regions 56 are described and illustrated as being separate from the substrate 50, as used herein the term "substrate" may be used to refer to just the semiconductor substrate or a semiconductor substrate inclusive of the isolation regions 56. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to the cross-section A-A and is along a longitudinal axis of the fin 58 and in a direction of, for example, a current flow between the source/drain regions 82 of the FinFET. Cross-section C-C is parallel to the cross-section A-A and extends through one of the source/drain regions 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 19B are cross-sectional views of intermediate stages in the manufacturing of FinFETs, in accordance with some embodiments. FIGS. 2 through 7 illustrate reference cross-section A-A illustrated in FIG. 1, except for illustrating multiple fins/FinFETs. In FIGS. 8A through 9B and FIGS. 14A through 19B, figures ending with an "A" designation are illustrated along reference cross-section A-A illustrated in FIG. 1, except for illustrating multiple fins/FinFETs, and figures ending with a "B" designation are illustrated along a similar cross-section B-B illustrated in FIG. 1. FIGS. 10 through 13 are illustrated along the cross-section B-B illustrated in FIG. 1.

Figure 2:
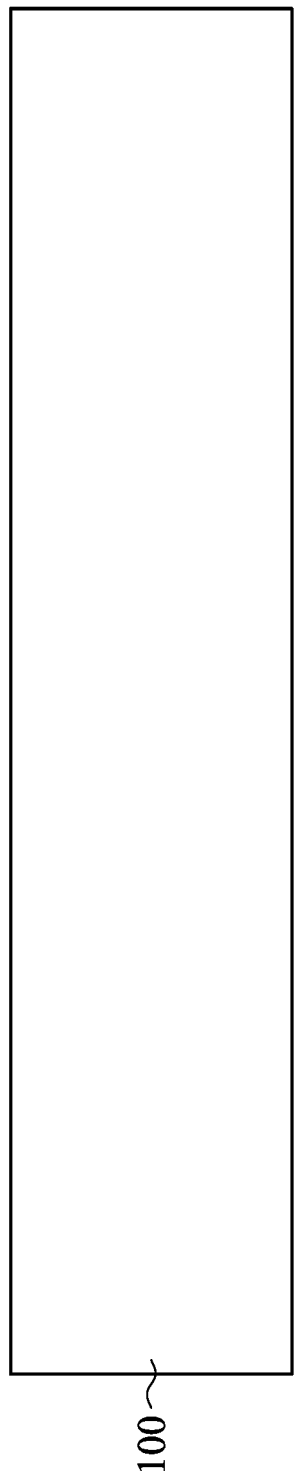
FIGS. 2-19B illustrates various intermediate cross-sectional views of forming a FinFET, in accordance with some embodiments.

In FIG. 2, a substrate 100 is provided. The substrate 100 may be a semiconductor substrate, such as a bulk semiconductor, a semiconductor-on-insulator (SOI) substrate, or the like, which may be doped (e.g., with a p-type dopant or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, which is typically a silicon or glass substrate. Other substrates, such as a multi-layered or gradient substrate may also be used.

The substrate 100 may have an n-well region or a p-well region formed therein (not explicitly illustrated). The n-well region or p-well region may be formed in the substrate 100 by performing an ion implantation process on the substrate 100. N-type dopants, such as arsenic ions, may be implanted into the substrate 100 to form the n-well region. P-type dopants, such as boron ions, may be implanted into the substrate 100 to form the p-well region.

Figure 3:

In FIG. 3, an epitaxial layer 114 is formed over the substrate 100. The epitaxial layer 114 may be formed by a process such as epitaxial growth or the like. The epitaxial layer 114 may comprise a material such as silicon germanium (SiGe), or the like, which may be doped (e.g., with a p-type or an n-type dopant) or undoped. In an embodiment, the epitaxial layer 114 comprises SiGe with a germanium percentage between about 10% and about 50%. SiGe comprises a lower bandgap than Si, allowing for greater hole mobility for subsequently formed PMOS devices. A planarization process may be performed on the epitaxial layer 114.

The epitaxial layer 114 may be planarized by any suitable planarization process, such as a chemical mechanical polish (CMP), an etch-back process, combinations thereof, or the like. In some embodiments, following the planarization process, the epitaxial layer 114 may have a thickness of between about 100 Å and about 5,000 Å.

Figure 4:
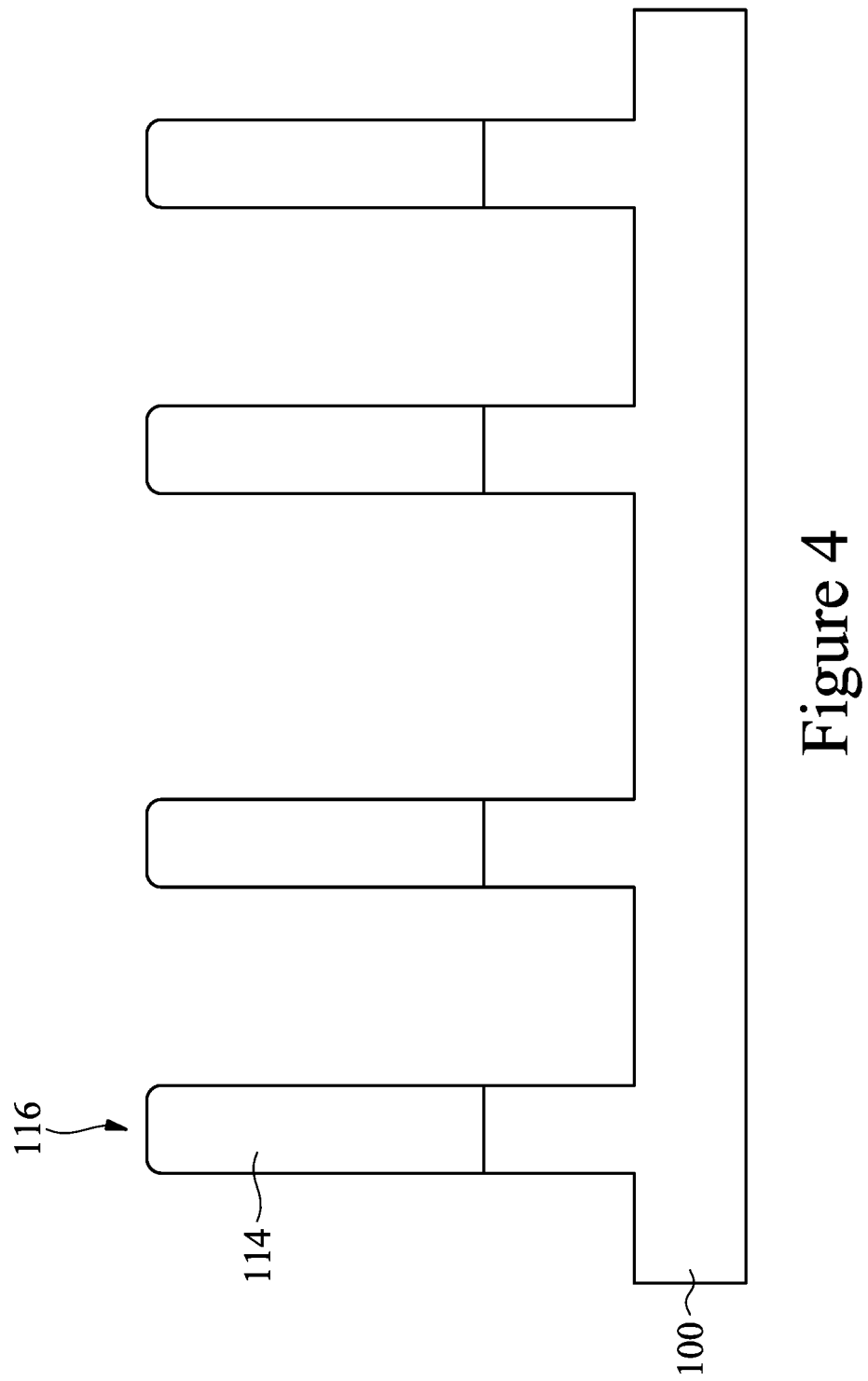

In FIG. 4, the epitaxial layer 114 and the substrate 100 are etched to form semiconductor fins 116. In some embodiments, the first semiconductor fins 116 may be formed by etching trenches in the epitaxial layer 114 and the substrate 100. The etching may be one or more of any acceptable etch process, such as a reactive ion etch (RIE), a neutral beam etch (NBE), the like, or a combination thereof. The etching may be anisotropic. Although the semiconductor fins 116 are illustrated as having rounded corners and linear edges, the semiconductor fins 116 may have any other suitable shape, such as having tapered sidewalls. In some embodiments, the semiconductor fins 116 may have a height of between about 10 Å and about 5,000 Å.

The semiconductor fins 116 may be patterned by any suitable method. For example, the semiconductor fins 116 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Although a double-patterning or multi-patterning process is not separately illustrated, in one embodiment, the double-patterning or multi-patterning process may include forming a sacrificial layer over a substrate. The sacrificial layer is patterned using a photolithography process. Spacers are formed alongside the sacrificial layer using a self-aligned process. The sacrificial layer is then removed and the remaining spacers are used to pattern first semiconductor fins 116.

Including the epitaxial layer 114 formed of, e.g., silicon germanium in the semiconductor fins 116 may increase the hole mobility of subsequently formed PMOS transistors. Additionally, because germanium has a smaller bandgap than silicon, including the epitaxial layer 114 in the semiconductor fins 116 may yield a higher current in subsequently formed PMOS transistors. In embodiments in which NMOS transistors are to be formed, the epitaxial layer 114 may be formed of a material that may increase the carrier mobility, such as silicon carbide. The silicon carbon may be doped with an n-type dopant such as phosphorus.

Figure 5:
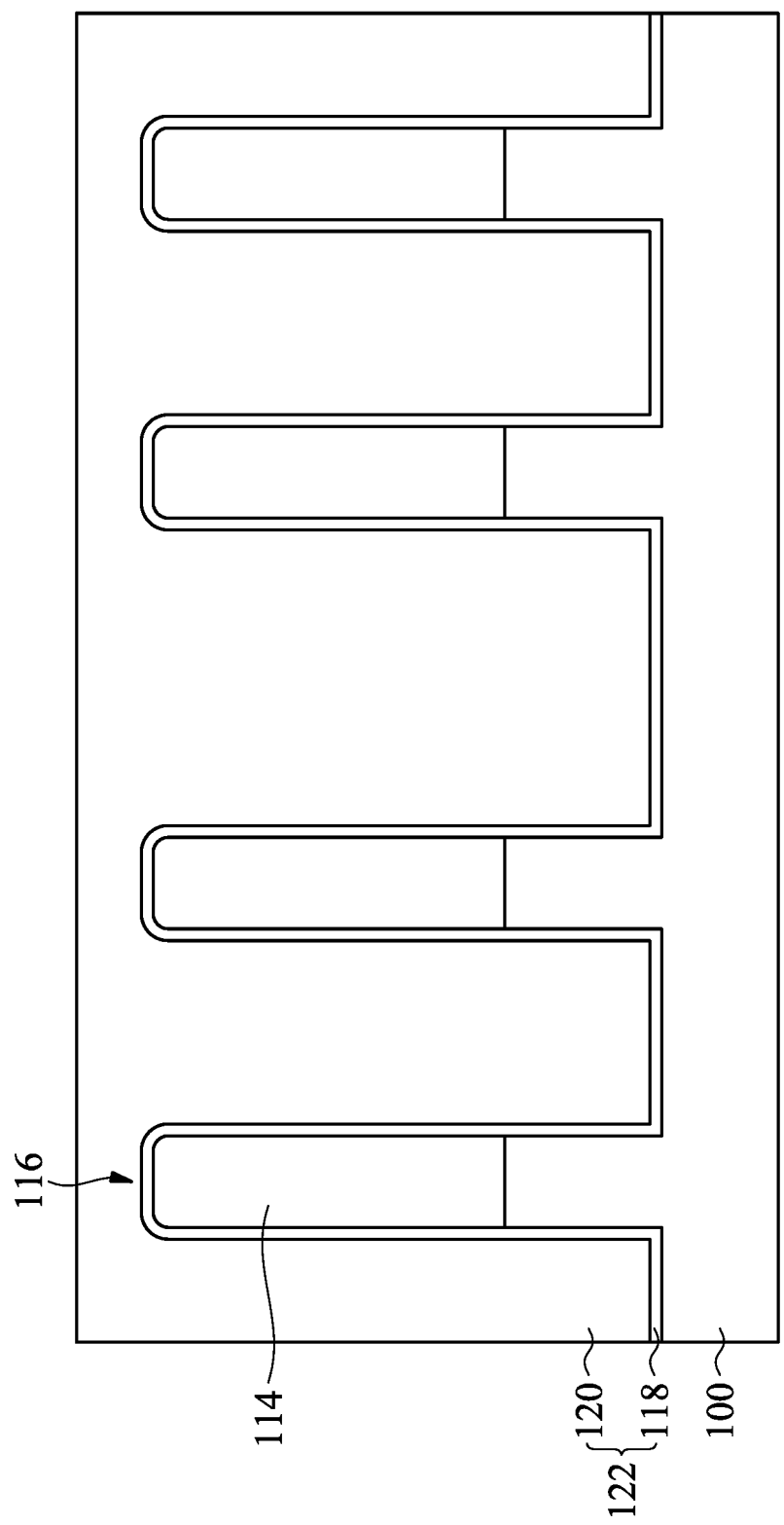

In FIG. 5, an insulation material 122 is formed over the substrate 100 and the semiconductor fins 116, filling openings between the semiconductor fins. In some embodiments, the insulation material 122 includes a liner 118 and a dielectric material 120 over the liner 118, as illustrated in FIG. 5. The liner 118 may be formed as a conformal layer, whose horizontal portions and vertical portions have thicknesses close to each other.

In some embodiments, the liner 118 is formed by oxidizing exposed surfaces of the substrate 100 and the semiconductor fins 116 in an oxygen-containing environment, for example, through Local Oxidation of Silicon (LOCOS), wherein oxygen ($O_2$) may be included in the respective process gas. In other embodiments, the liner 118 may be formed using, for example, In-Situ Steam Generation (ISSG) with water steam or a combined gas of hydrogen ($H_2$) and oxygen ($O_2$) used to oxidize the exposed surfaces of the substrate 100 and the semiconductor fins 116. In yet other embodiments, the liner 118 is formed using a deposition technique, such as ALD, CVD, sub-atmospheric chemical vapor deposition (SACVD), the like, or a combination thereof. In some embodiments, the liner 118 may have a thickness of between about 0.2 Å and about 100 Å.

The dielectric material 120 is formed to fill remaining portions of the openings between the semiconductor fins 116. The dielectric material 120 may overfill the openings between the semiconductor fins 116, such that a portion of the dielectric material 120 extends above top surfaces of the semiconductor fins 116. In some embodiments, the dielectric material 120 may comprise silicon oxide, silicon carbide, silicon nitride, the like, or a combination thereof, and may be formed using flowable chemical vapor deposition (FCVD), spin-on coating, CVD, ALD, high-density plasma chemical vapor deposition (HDPCVD), low pressure chemical vapor deposition (LPCVD), the like, or a combination thereof. After the dielectric material 120 is deposited, an anneal/curing step may be performed, which may convert the flowable dielectric material 120 into a solid dielectric material. In some embodiments, an interface between the liner 118 and the dielectric material 120 may be distinguishable due to different material properties such as different types of materials and/or different densities.

Figure 6:
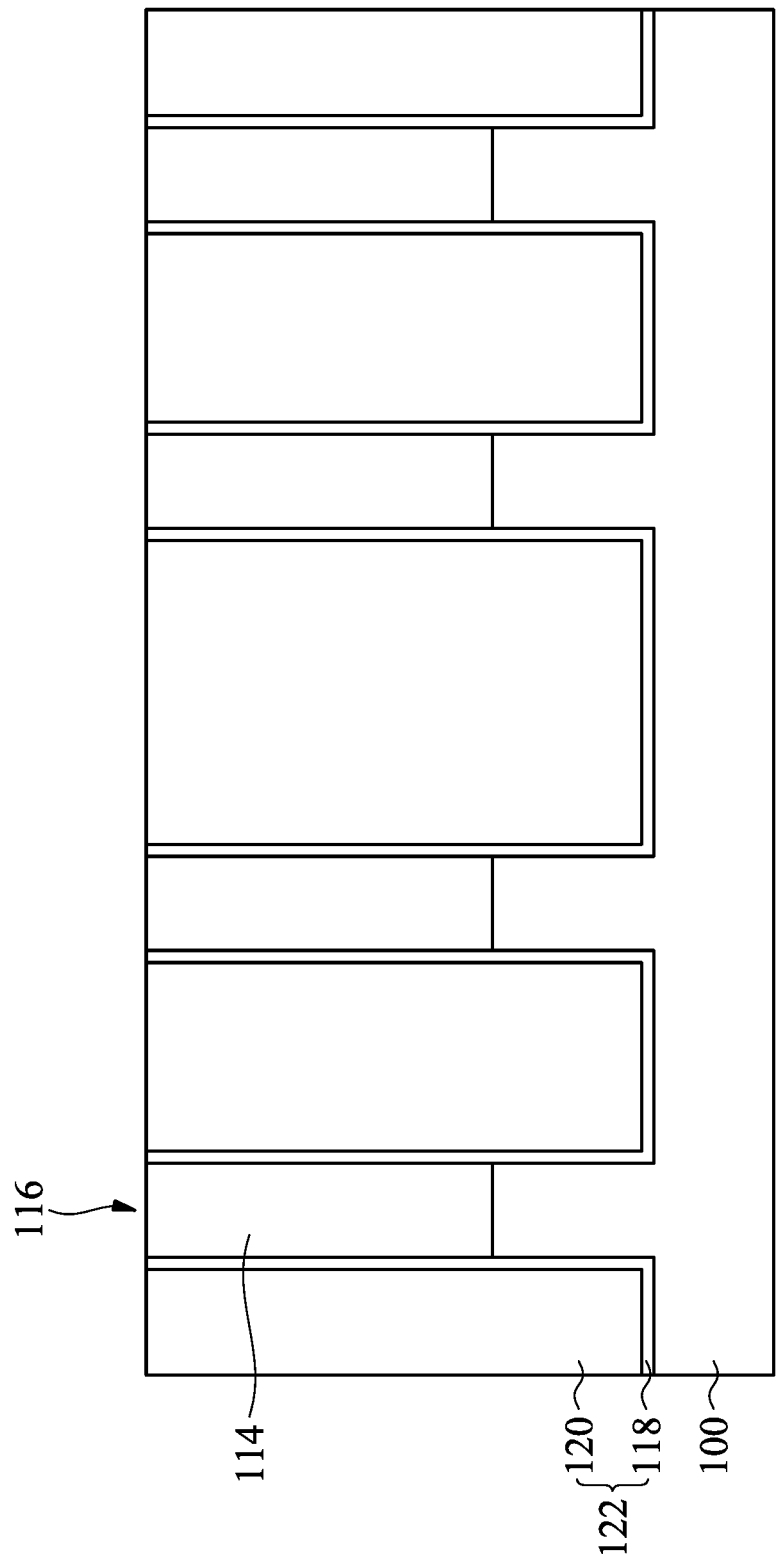

In FIG. 6, a planarization process is applied to the insulation material 122. In some embodiments, the planarization process includes a chemical mechanical polish (CMP), an etch-back process, combinations thereof, or the like. As illustrated in FIG. 6, the planarization process may expose top surfaces of the semiconductor fins 116. Portions of the semiconductor fins 116 may also be planarized by the planarization process. Top surfaces of the semiconductor fins 116 and the insulation material 122 are level (within process variations) after the planarization process is complete.

Figure 7:
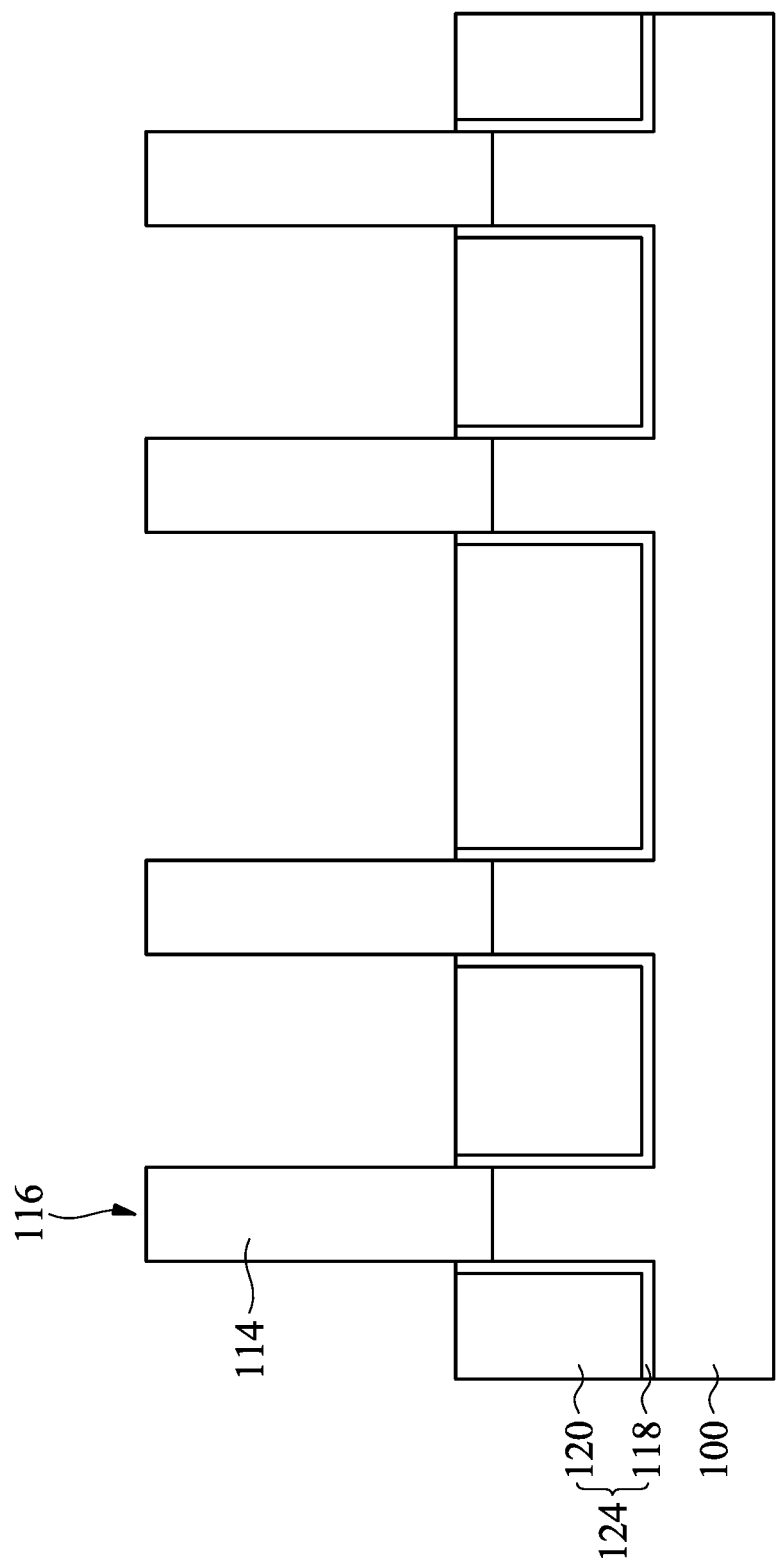

In FIG. 7, the insulation material 122 is recessed to form shallow trench isolation (STI) regions 124. The insulation material 122 is recessed such that the semiconductor fins 116 protrude from between neighboring STI regions 124. The STI regions 124 may be recessed using an acceptable etching process, such as one that is selective to the material of the STI regions 124. For example, a chemical oxide removal using a plasma-less gaseous etching process (e.g., an etching process using hydrogen fluoride (HF) gas, ammonia ($NH_3$) gas, or the like), a remote plasma assisted dry etch process (e.g., a process using hydrogen ($H_2$), nitrogen trifluoride ($NF_3$), and ammonia by-products, or the like), or dilute hydrofluoric (dHF) acid may be used.

Figure 8A:
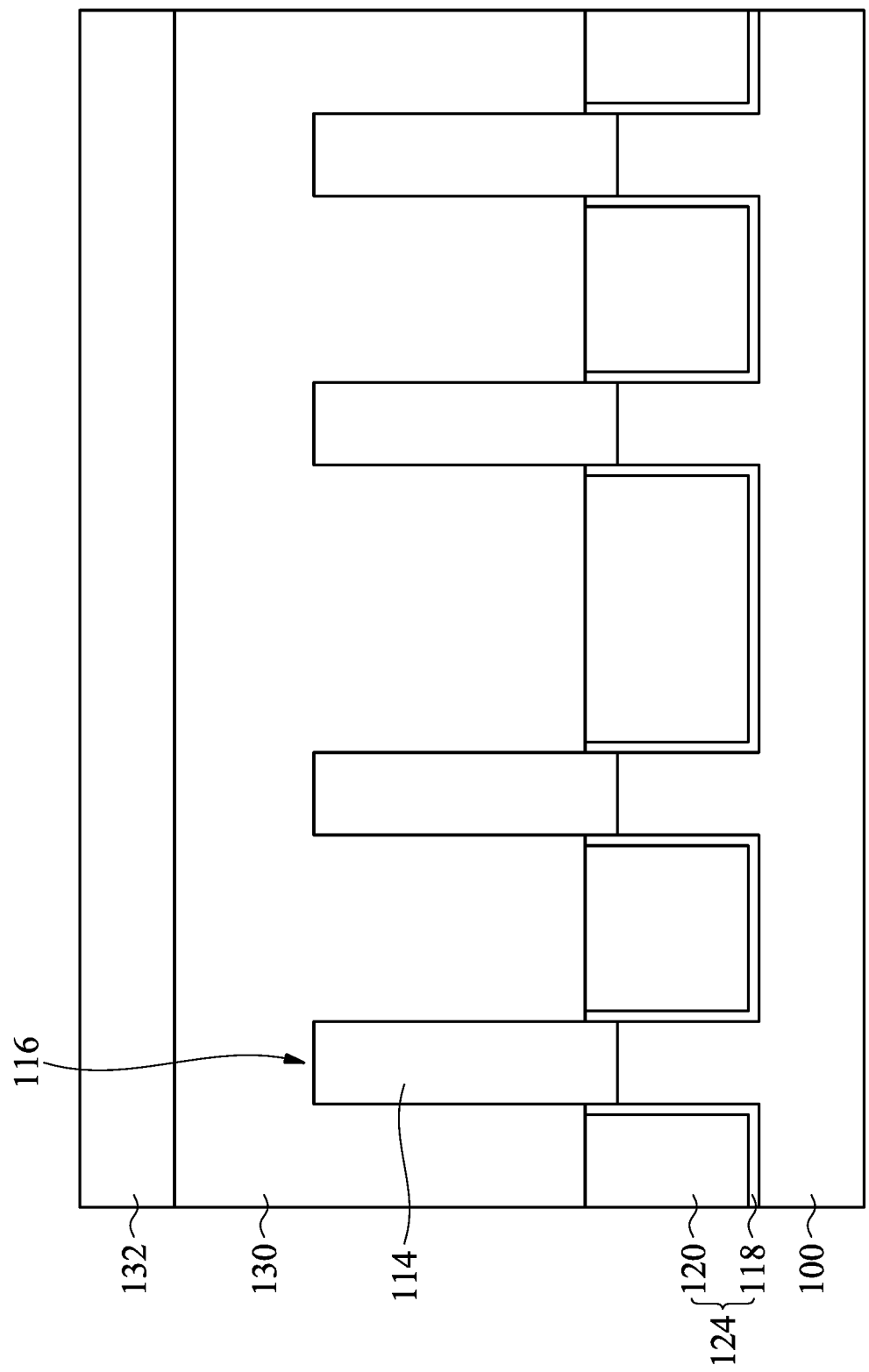
Figure 8B:
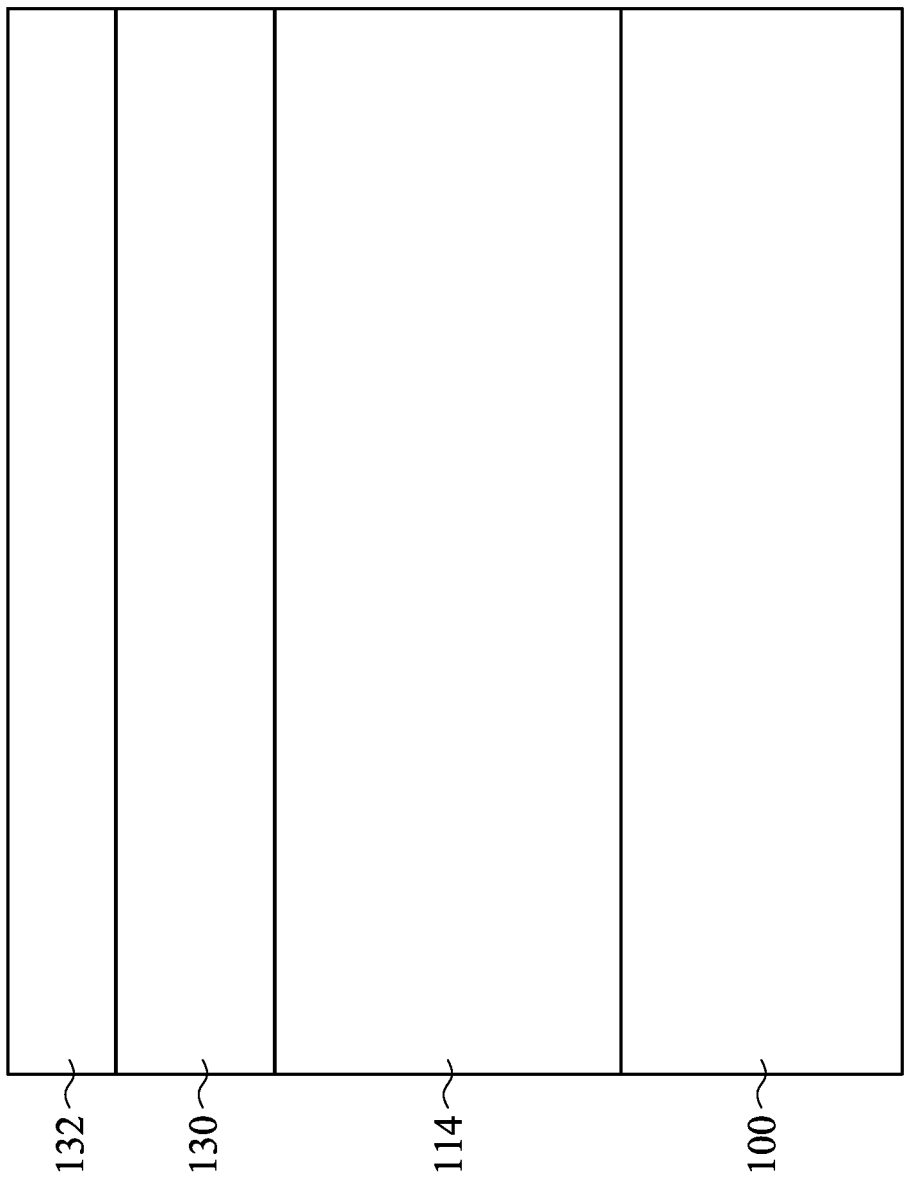

In FIGS. 8A and 8B, a dummy gate layer 130 is formed over the semiconductor fins 116 and the STI regions 124, and a mask layer 132 is formed over the dummy gate layer 130. Prior to forming the dummy gate layer 130, a dummy dielectric layer (not explicitly illustrated) may be formed over the semiconductor fins 116 and the STI regions 124. The dummy dielectric layer may be, for example, silicon oxide, silicon nitride, a combination thereof, or the like, and may be deposited or thermally grown according to acceptable techniques. The dummy gate layer 130 may be deposited over the semiconductor fins 116 and then planarized, such as by a CMP. The mask layer 132 may be deposited over the dummy gate layer 130. The dummy gate layer 130 may be, for example, amorphous silicon, polycrystalline-silicon (polysilicon), poly-crystalline silicon-germanium (poly-SiGe), metallic nitrides, metallic silicides, metallic oxides, and metals. The dummy gate layer 130 may be deposited by physical vapor deposition (PVD), CVD, sputter deposition, or other techniques known and used in the art for depositing conductive materials. The dummy gate layer 130 may be made of other materials that have a high etching selectivity from the etching of isolation regions. The mask layer 132 may include, for example, SiN, SiON, or the like.

Figure 9A:
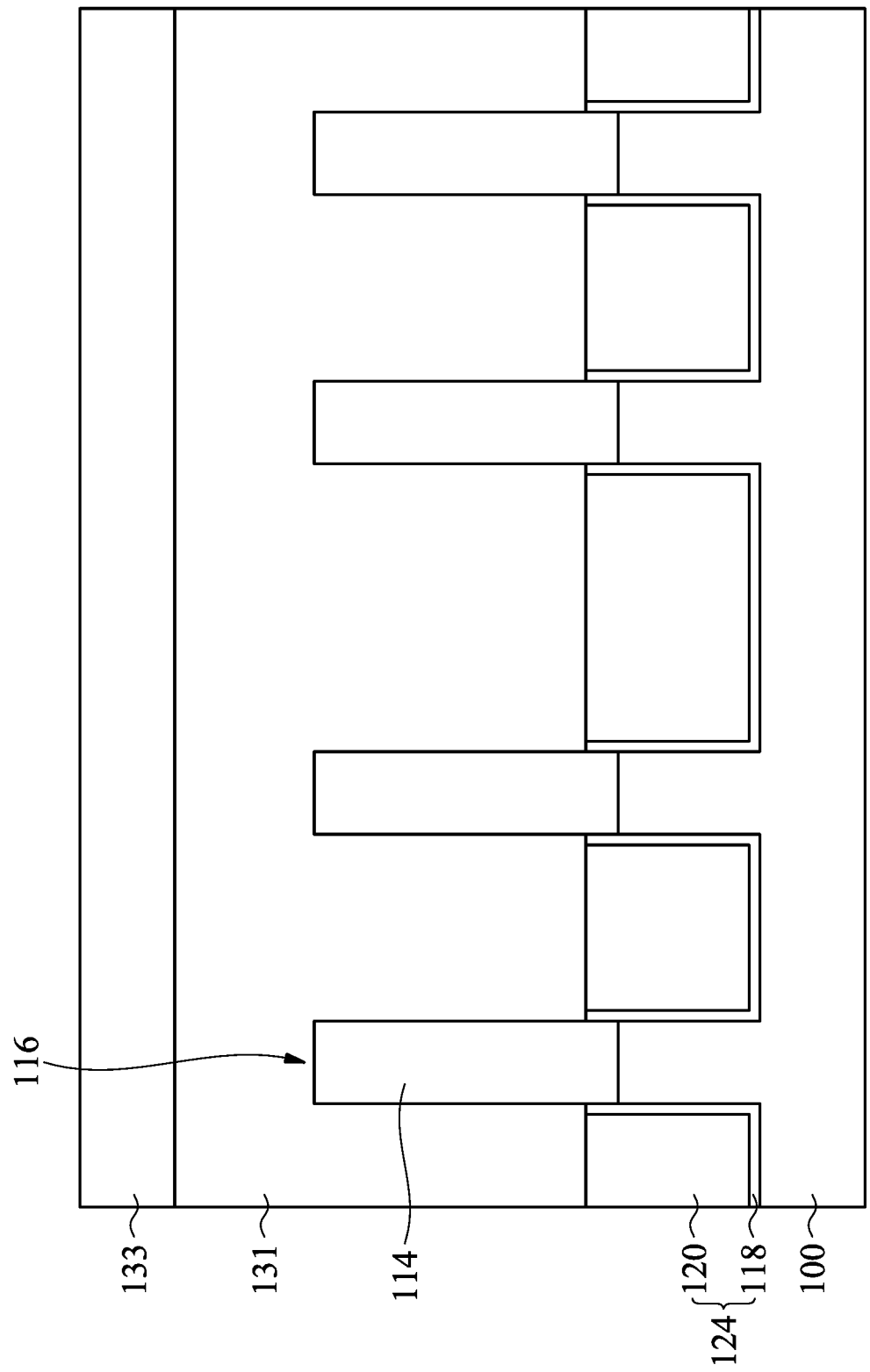

In FIGS. 9A and 9B, the mask layer 132 (see FIGS. 8A and 8B) may be patterned using acceptable photolithography and etching techniques to form masks 133. The pattern of the masks 133 may be transferred to the dummy gate layer 130 by an acceptable etching technique to form dummy gates 131. The dummy gates 131 cover respective channel regions of the semiconductor fins 116. The pattern of the masks 133 may be used to physically separate each of the dummy gates 131 from adjacent dummy gates 131. The dummy gates 131 may also have a lengthwise direction substantially perpendicular to the lengthwise direction of the semiconductor fins 116.

Figure 10:
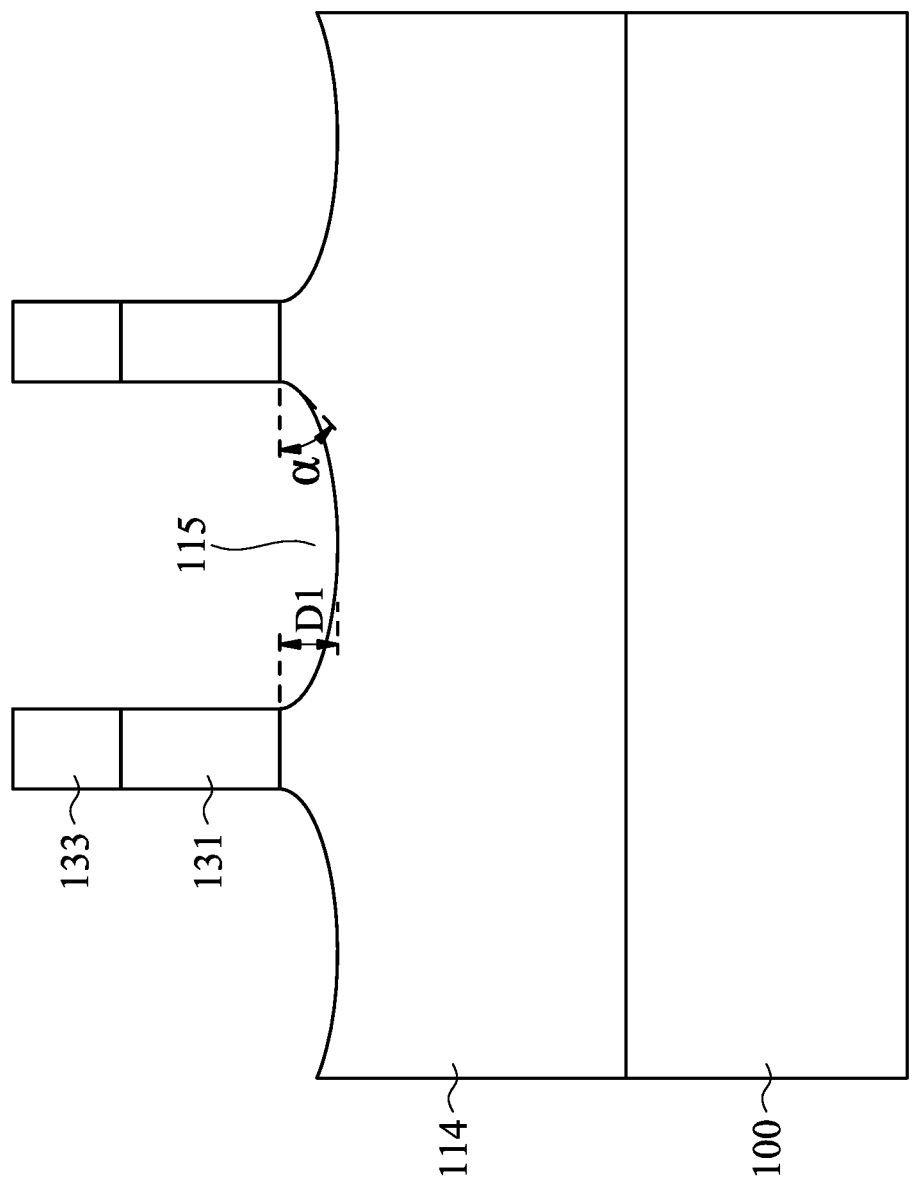

In FIG. 10, the epitaxial layer 114 is etched using dummy gates 131 as masks to form first recesses 115 on either side of the dummy gates 131. In embodiments in which the epitaxial layer 114 comprises silicon germanium, the etch may comprise a dry etch process using $Cl_2$, HBr, HF, $SF_6$, $CHF_3$, $CH_2F_2$, $CF_4$, $SO_2$, $NH_3$, $NF_3$, He, $SiCl_4$, $O_2$, Ar, $H_2$ and/or other gaseous etchants. The etch may be performed at a temperature between about room temperature and about 500° C., at a pressure between about $10^{-3}$ mTorr and about 760 Torr, for a time period between about 0.1 s and about 500 s. As illustrated in FIG. 10, a surface of the epitaxial layer 114 in the resulting first recesses 115 will have shallow, concave surfaces due to the etching being along the crystal planes of the SiGe of the epitaxial layer 114. In an embodiment, the first recesses 115 may have a first depth D1 measured between a lowest point of the first recesses 115 and a point level with a top surface of the epitaxial layer 114 of between about 1 nm to 10 nm. The first recesses 115 may have a width measured between adjacent sidewalls of dummy gates 131 of about 20 nm to about 200 nm, at an angle α between about 5° and about 60° between the surface level with the top surface of the epitaxial layer 114 and a sidewall of the first recesses 115, as illustrated in FIG. 10.

Figure 11:
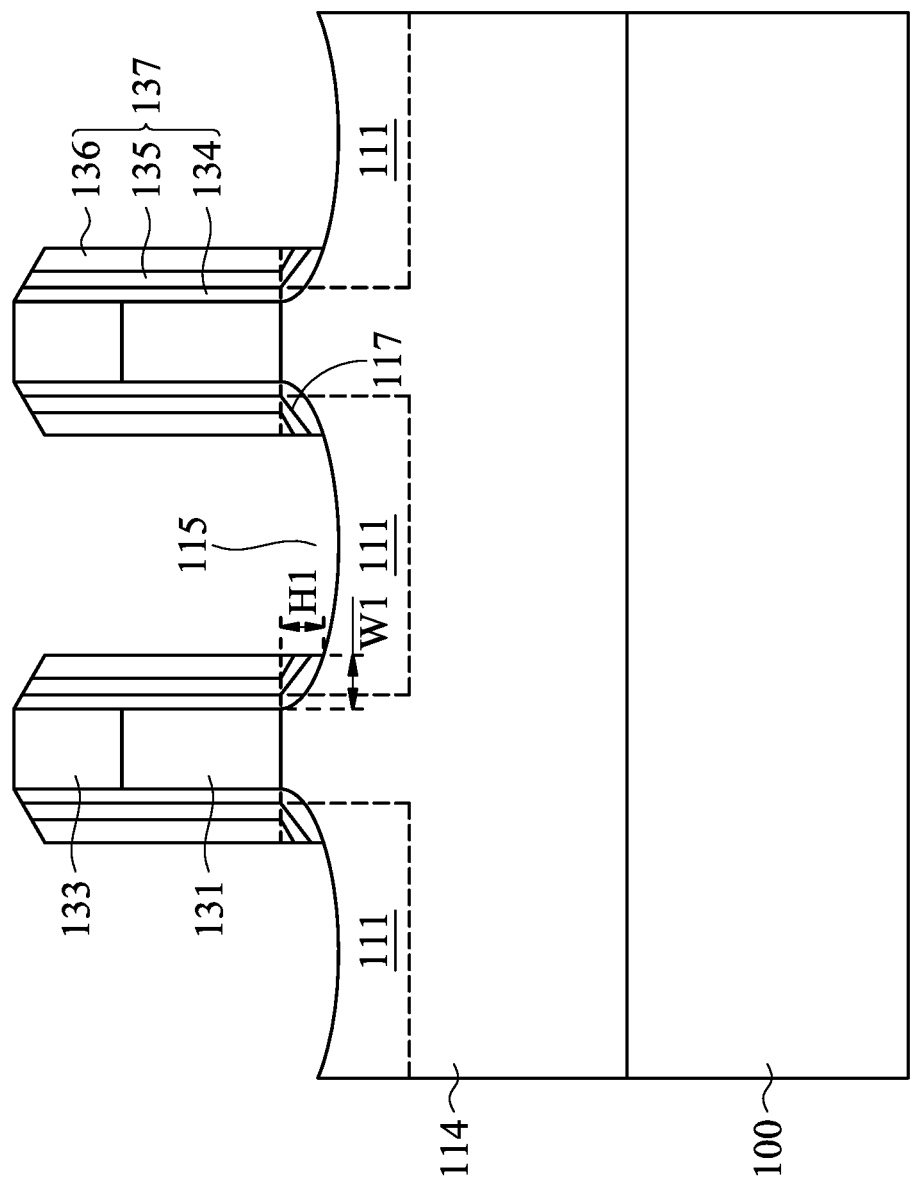

In FIG. 11, gate spacers 137 are formed along sidewalls of the dummy gates 131 and the masks 133. In an embodiment, the gate spacers 137 may be formed by conformally depositing a material over the top surface and sidewalls of the dummy gates 131 and the masks 133 and subsequently anisotropically etching the material to remove the portions located above a top surface of the masks 133 and the portions located farther than a width W1 from the sidewalls of the dummy gates 131, as illustrated in FIG. 11. The material of the gate spacers 137 may be silicon nitride, SiCN, SiOC, SiOCN, a combination thereof, or the like.

In various embodiments, the gate spacers 137 may comprise a plurality of gate subspacers. In an embodiment illustrated in FIGS. 11-19B, the gate spacers 137 comprise three gate subspacers: first gate subspacers 134, second gate subspacers 135, and third gate subspacers 136. The first gate subspacers 134 are an etch stop for removing the dummy gates 131 during subsequent processing. The first gate subspacers 134 may have a thickness between about 0.5 nm and about 5 nm. In an embodiment, the second gate subspacers 135 reduce the capacitance of the device structure. The second gate subspacers 135 may have a thickness between about 0.5 nm and about 5 nm. In an embodiment, the third gate subspacers 135 may be a dummy or sacrificial spacer layer, to be used as a sacrificial etch stop later in the fabrication process. The third gate subspacers 136 may have a thickness between about 1 nm and about 10 nm. The first gate subspacers 134 and the second gate subspacers 136 may comprise the same materials or may comprise different materials. In an embodiment, the third gate subspacers 136 comprise a different material from at least the second gate subspacers 135, in order to be used as a sacrificial etch stop.

After the formation of the first gate subspacers 134, implants for lightly doped source/drain (LDD) regions 111 may be performed. In some embodiments such as for PMOS devices, appropriate type (e.g., p-type) impurities may be implanted into the exposed semiconductor fins 116. The p-type impurities may be boron, $BF_2$, or the like. In other embodiments such as for NMOS devices, appropriate type (e.g., n-type) impurities may be implanted into the exposed semiconductor fins 116. The n-type impurities may be phosphorus, arsenic, or the like. The LDD regions 111 may have a concentration of impurities of from about $10^{15}$ cm$^{-3}$ to about $10^{16}$ cm$^{-3}$. An anneal may be used to activate the implanted impurities. FIG. 11 illustrates a non-limiting example of the LDD regions 111. Other configurations, shapes, and formation methods of the LDD regions 111 are also possible and are fully intended to be included within the scope of the present disclosure. Additionally, the gate spacers may have different configurations, including, for example, varying number of subspacers, varying shapes (e.g., L-shaped spacers), and/or the like. In subsequent drawings, LDD regions 111 are not shown for illustrative purposes only.

In an embodiment, the gate spacers 137 will extend to the bottom surface of the first recess 115, forming triangular spacer extensions 117 as illustrated in FIG. 11. The triangular spacer extensions 117 will block diffusion of metal from metal contacts to source/drain regions, thereby reducing parasitic capacitance of the device. In an embodiment, triangular spacer extensions 117 may comprise a triangular-shaped profile extending into the first recesses 115. In an embodiment, the triangular spacer extensions 117 comprise a height H1 between about 1 nm and about 10 nm and the width W1 between about 1 nm and about 10 nm, as illustrated in FIG. 11. In various embodiments, the ratio of height H1 to width W1 may be between about 0.1 to 10. These dimensions and ratios have a strong correlation with the performance of the device and the parasitic capacitance, as a high H1:W1 ratio may cause the device performance to degrade, while a low H1:W1 may lead to excessively high source/drain area parasitic capacitance.

Figure 12:
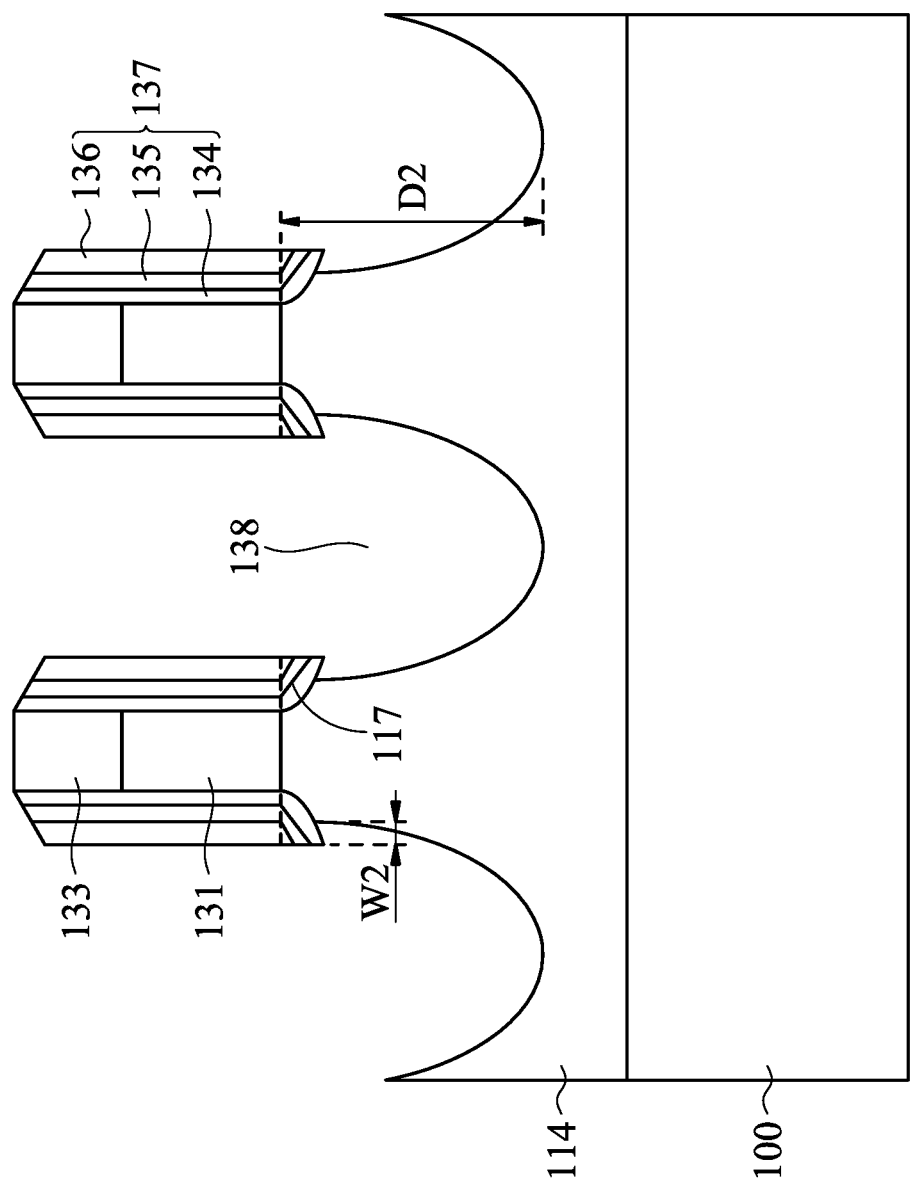

In FIG. 12, second recesses 138 are formed in the epitaxial layer 114 using the gate spacers 137 as a mask. The second recesses 138 are formed to a greater depth D2 than a depth D1 of the first recesses 115. The depth D2 of the second recesses 138 may be between about 35 nm and 70 nm. In some embodiments, the second recesses 138 may extend through the epitaxial layer 114 into the substrate 100. The second recesses 138 may be formed by an anisotropic etch using $Cl_2$, HBr, HF, $SF_6$, $CHF_3$, $CH_2F_2$, $CF_4$, $SO_2$, $NH_3$, $NF_3$, He, $SiCl_4$, $O_2$, Ar, $H_2$ and/or other gaseous etchants. The etch may be performed at a temperature between about room temperature and about 500° C., at a pressure between about $10^{-3}$ mTorr and about 760 Torr, for a time period between about 0.1 s and about 500 s As illustrated in FIG. 12, the etching of the second recesses 138 may undercut the triangular spacer extensions to a width W2, which may be between 0 nm and 5 nm.

Figure 13:
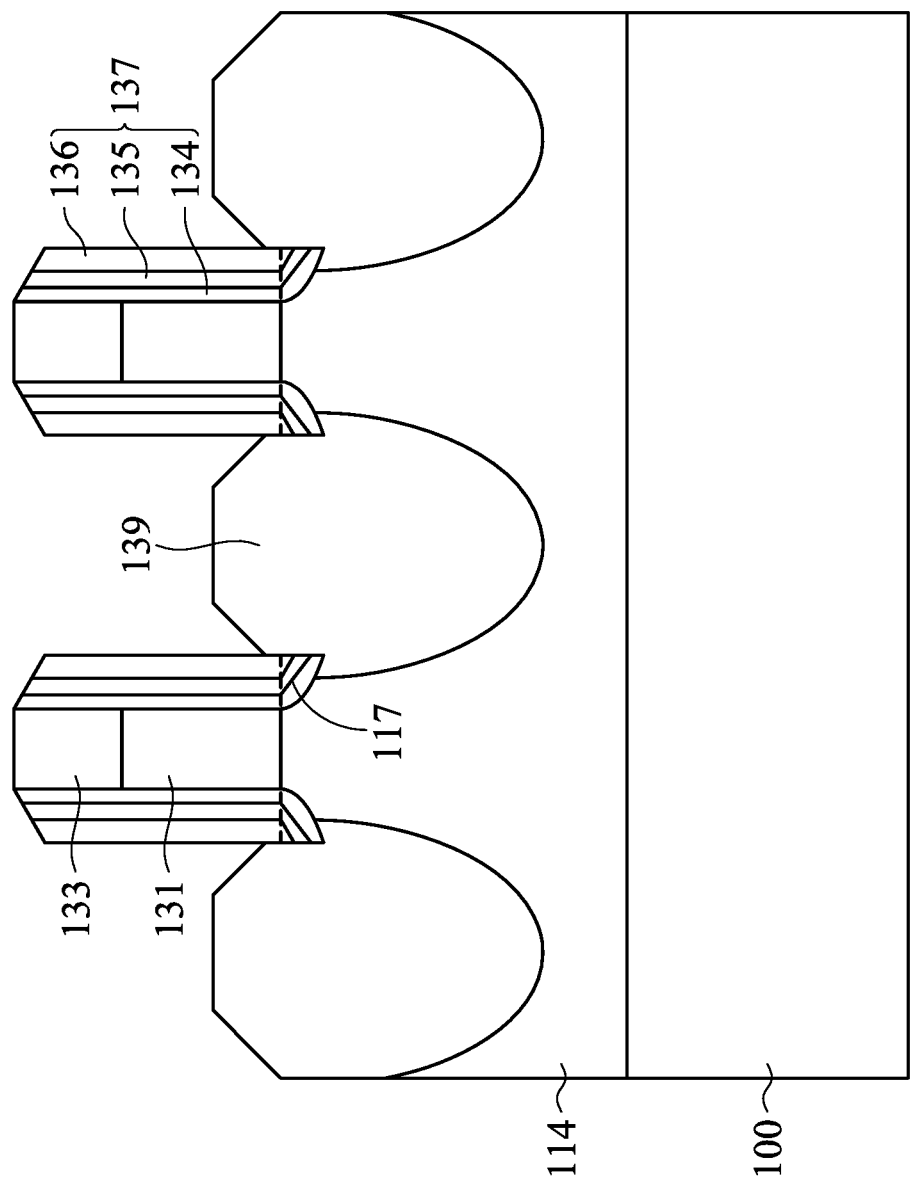

In FIG. 13, the epitaxial source/drain regions 139 may be formed by being epitaxially grown in the second recesses 139. In some embodiments, the epitaxial source/drain regions 139 may extend through the epitaxial layer 114 into the substrate 100. In some embodiments, the second gate subspacers 135 are used to separate the epitaxial source/drain regions 139 from the dummy gates 131 by an appropriate lateral distance so that the epitaxial source/drain regions 139 do not short out subsequently formed gates of the resulting FinFETs.

In some embodiments, the epitaxial source/drain regions 139 may include any acceptable material appropriate for p-type FinFETs. For example, the epitaxial source/drain regions 139 may include SiGe, SiGeB, Ge, GeSn, or the like. The epitaxial source/drain regions 139 may be formed of a material having a greater lattice constant than the lattice constant of the epitaxial layer 114, creating a compressive stress in the channel region to increase hole mobility for PMOS devices. In an exemplary embodiment, the epitaxial source/drain regions 139 comprise SiGeB with a germanium percentage about 20% higher than the germanium percentage of the SiGe comprising the epitaxial layer 114. The epitaxial source/drain regions 139 may have surfaces raised from respective surfaces of the semiconductor fins 116 and may have facets.

In other embodiments, the epitaxial source/drain regions 139 may include any acceptable material appropriate for n-type FinFETs. For example, the epitaxial source/drain regions 139 may include silicon, SiC, SiCP, SiP, or the like. The epitaxial source/drain regions 139 may be formed of a material having a smaller lattice constant than the lattice constant of the epitaxial layer 114, creating a tensile stress in the channel region to increase electron mobility for NMOS devices. The epitaxial source/drain regions 139 may also have surfaces raised from respective surfaces of the semiconductor fins 116 and may have facets.

The epitaxial source/drain regions 139 and/or the semiconductor fins 116 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The p-type impurities for source/drain regions may be any of the impurities previously discussed. In some embodiments, the epitaxial source/drain regions 139 may be in situ doped during growth.

Figure 14A:
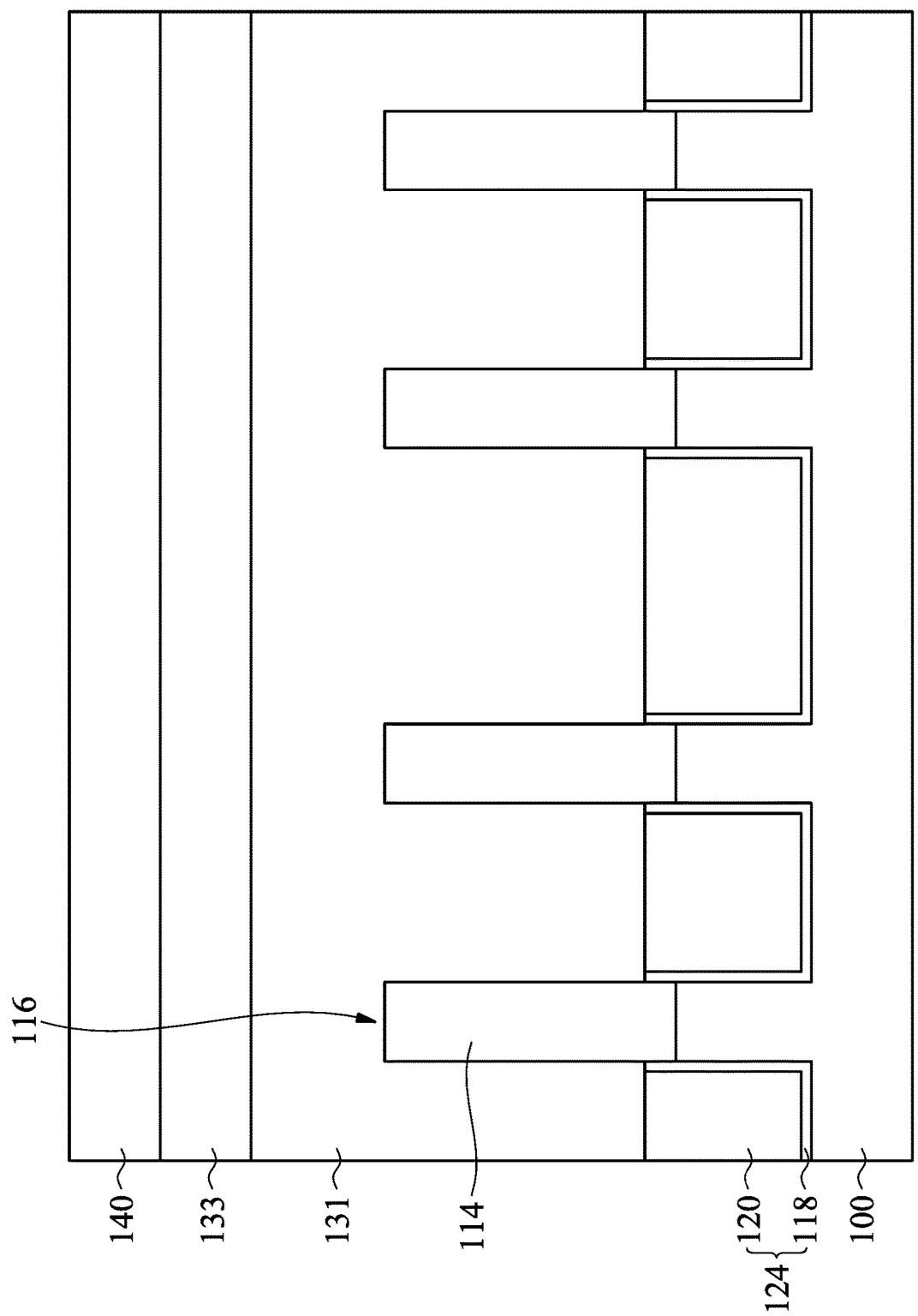
Figure 14B:
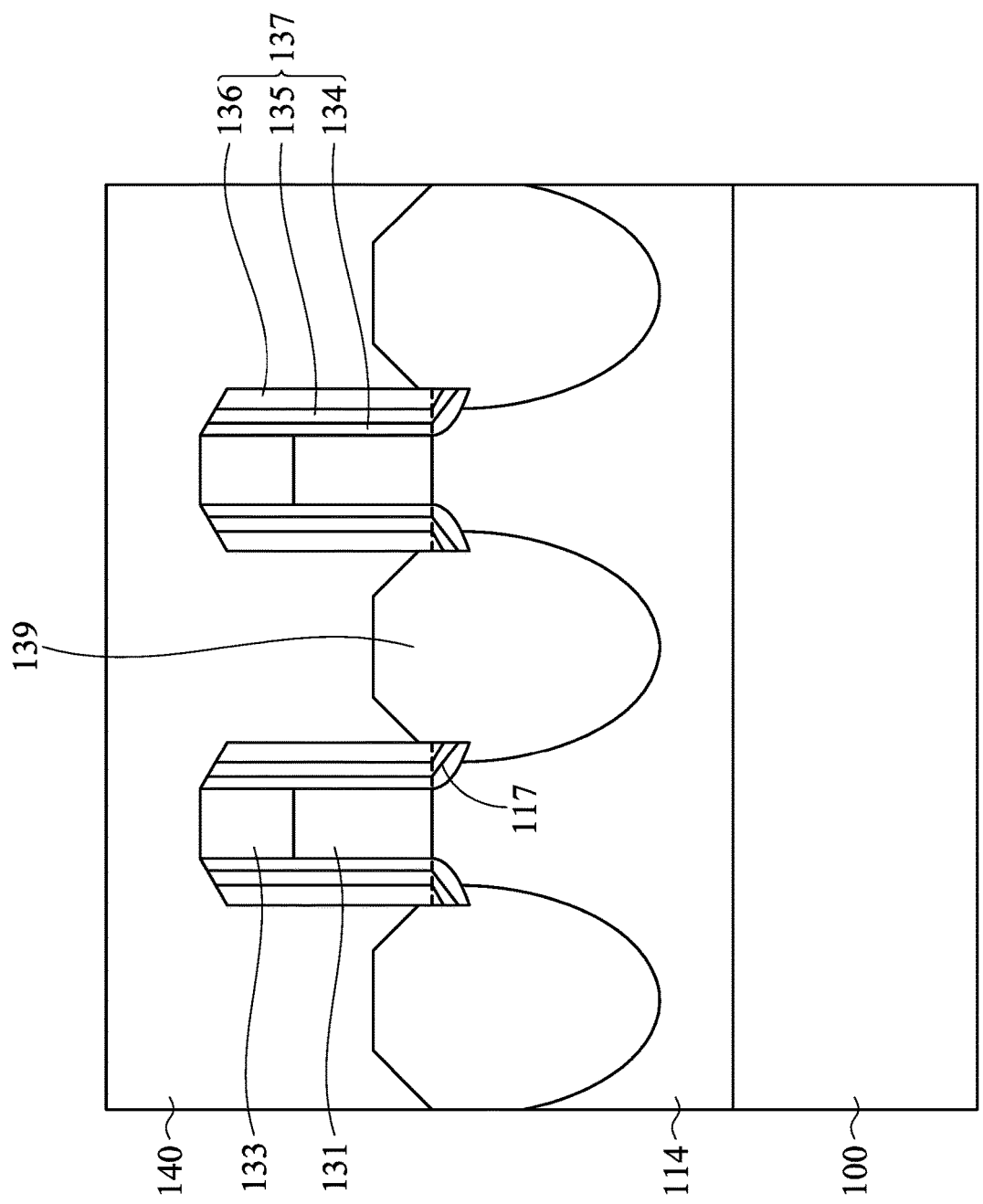

In FIGS. 14A and 14B, a first interlayer dielectric (ILD) 140 is deposited in accordance with some embodiments. The first ILD 140 may be formed of a dielectric material, and may be deposited by any suitable method, such as CVD, plasma-enhanced CVD (PECVD), or flowable CVD (FCVD). Dielectric materials may include phosphosilicate glass (PSG), borosilicate glass (BSG), boron-doped phosphosilicate glass (BPSG), undoped silicate glass (USG), or the like. Other insulation formed by any acceptable process may be used. In some embodiments, a contact etch stop layer (CESL, not separately illustrated), is disposed between the first ILD 140 and the epitaxial source/drain regions 139, the masks 133, and the gate spacers 137.

Figure 15A:
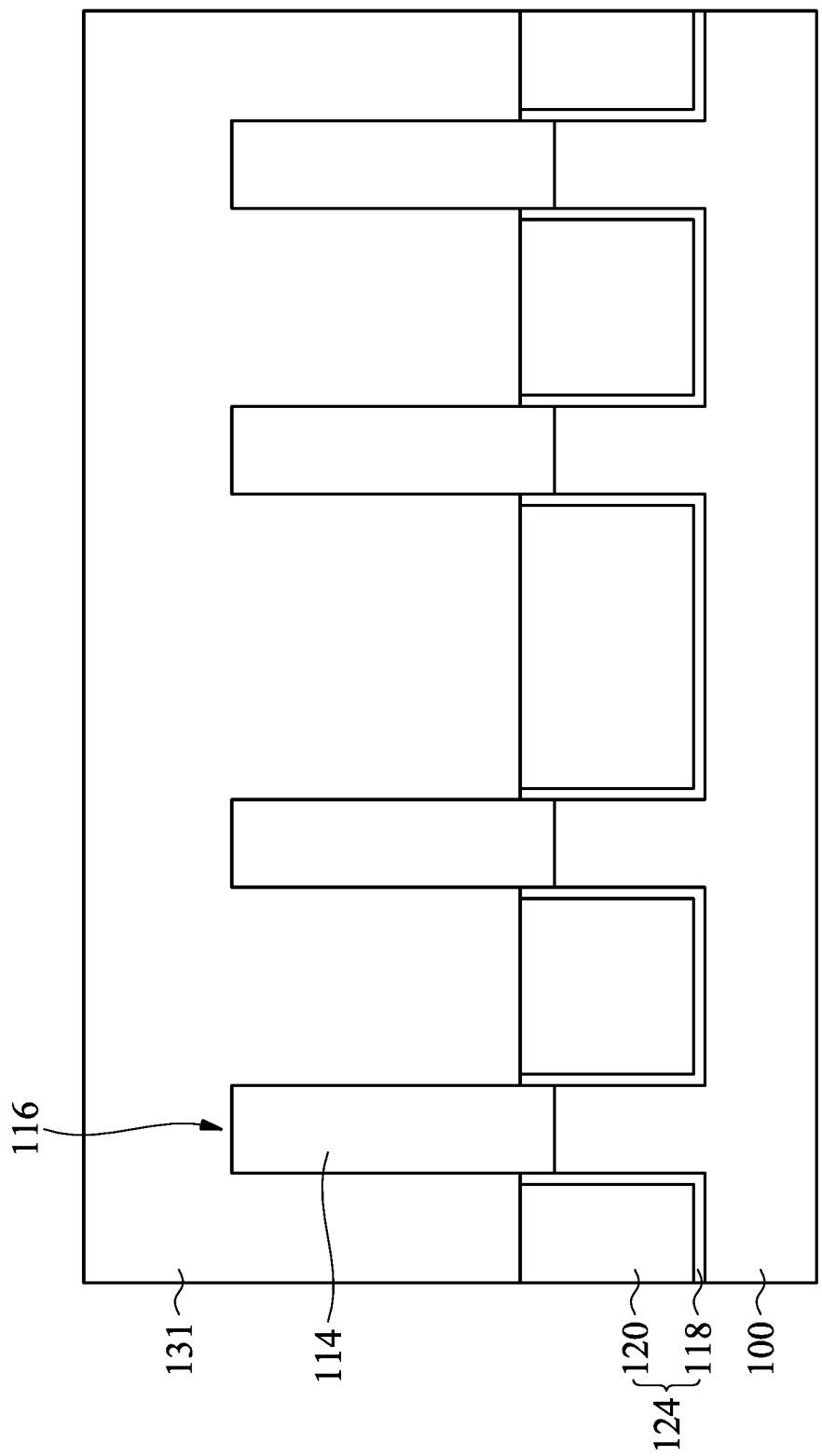
Figure 15B:
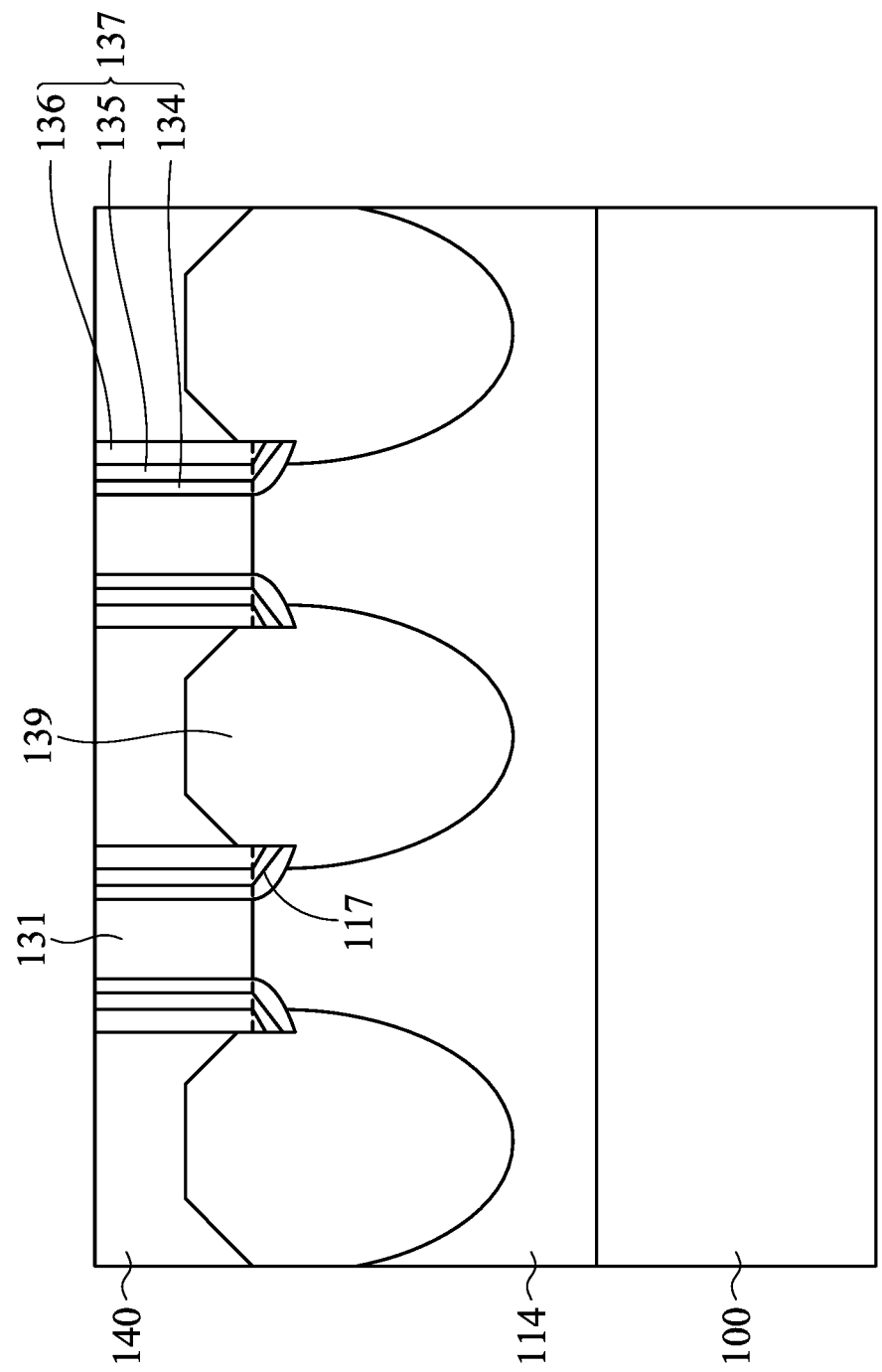

In FIGS. 15A and 15B, a planarization process, such as a CMP, may be performed to level the top surface of the first ILD 140 with the top surfaces of the dummy gates 131. The planarization process may also remove the masks 133 on the dummy gates 131, and portions of the gate spacers 137 along sidewalls of the masks 133. After the planarization process, top surfaces of the dummy gates 131, the gate spacers 137, and the first ILD 140 are level. Accordingly, the top surfaces of the dummy gates 131 are exposed through the first ILD 140.

Figure 16A:
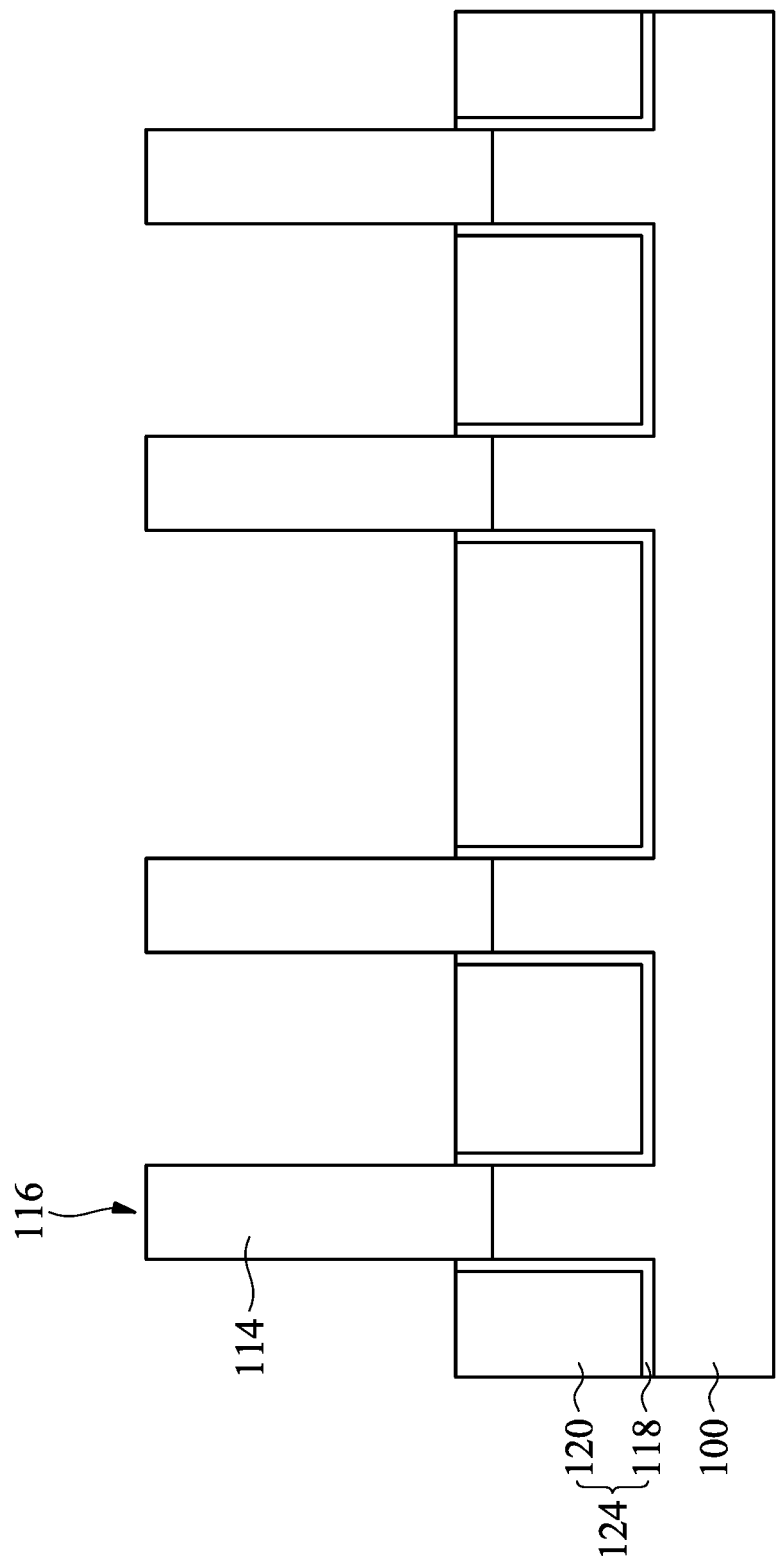
Figure 16B:
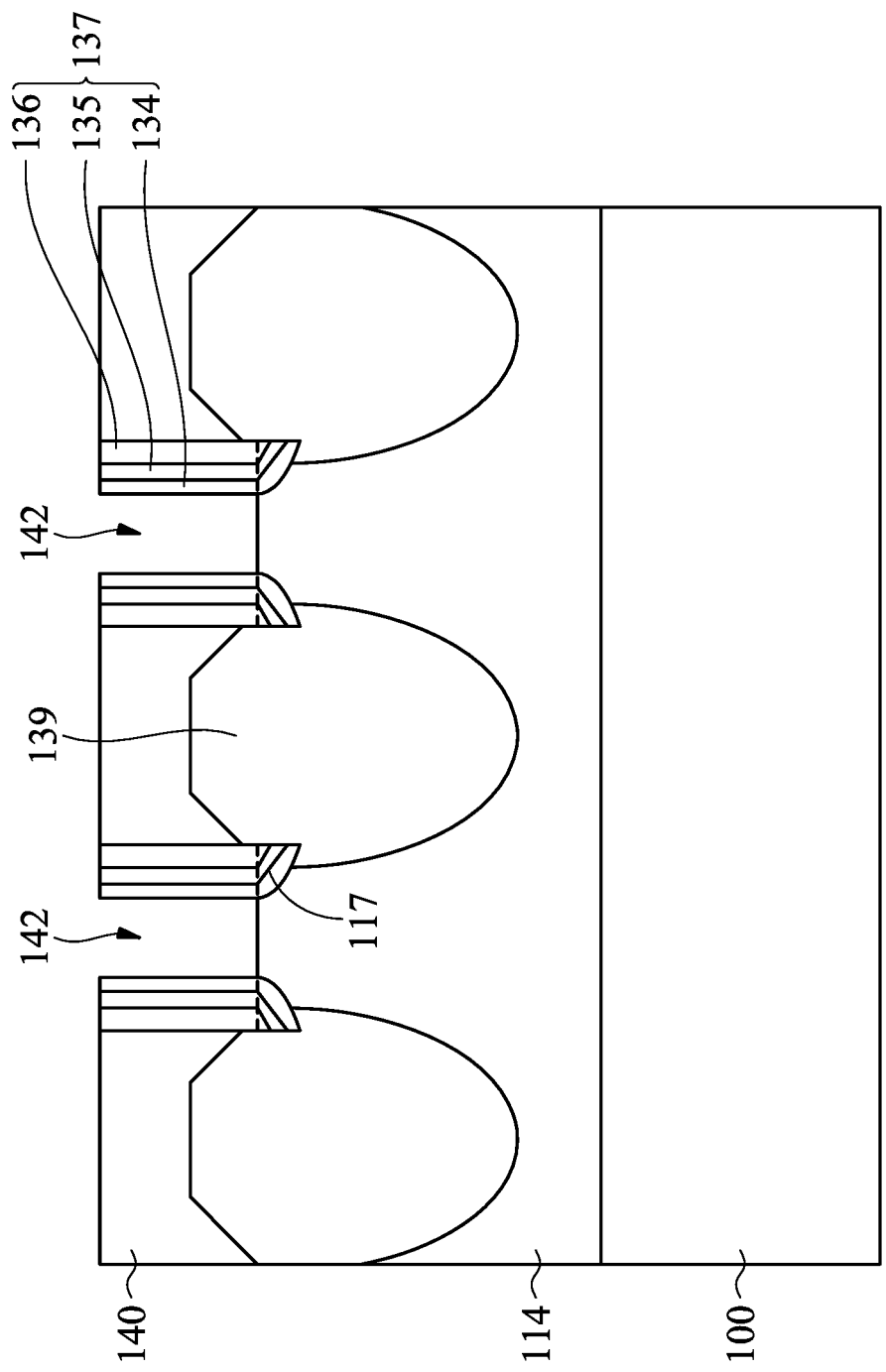

In FIGS. 16A and 16B, the dummy gates 131 are removed in an etching step(s), so that recesses 142 are formed. In some embodiments, the dummy gates 131 are removed by an anisotropic dry etch process. For example, the etching process may include a dry etch process using reaction gas(es) that selectively etch the dummy gates 131 without etching the first ILD 140 or the gate spacers 136. Each recess 142 exposes a channel region of a respective semiconductor fin 116. Each channel region is disposed between neighboring pairs of the epitaxial source/drain regions 139.

Figure 17A:
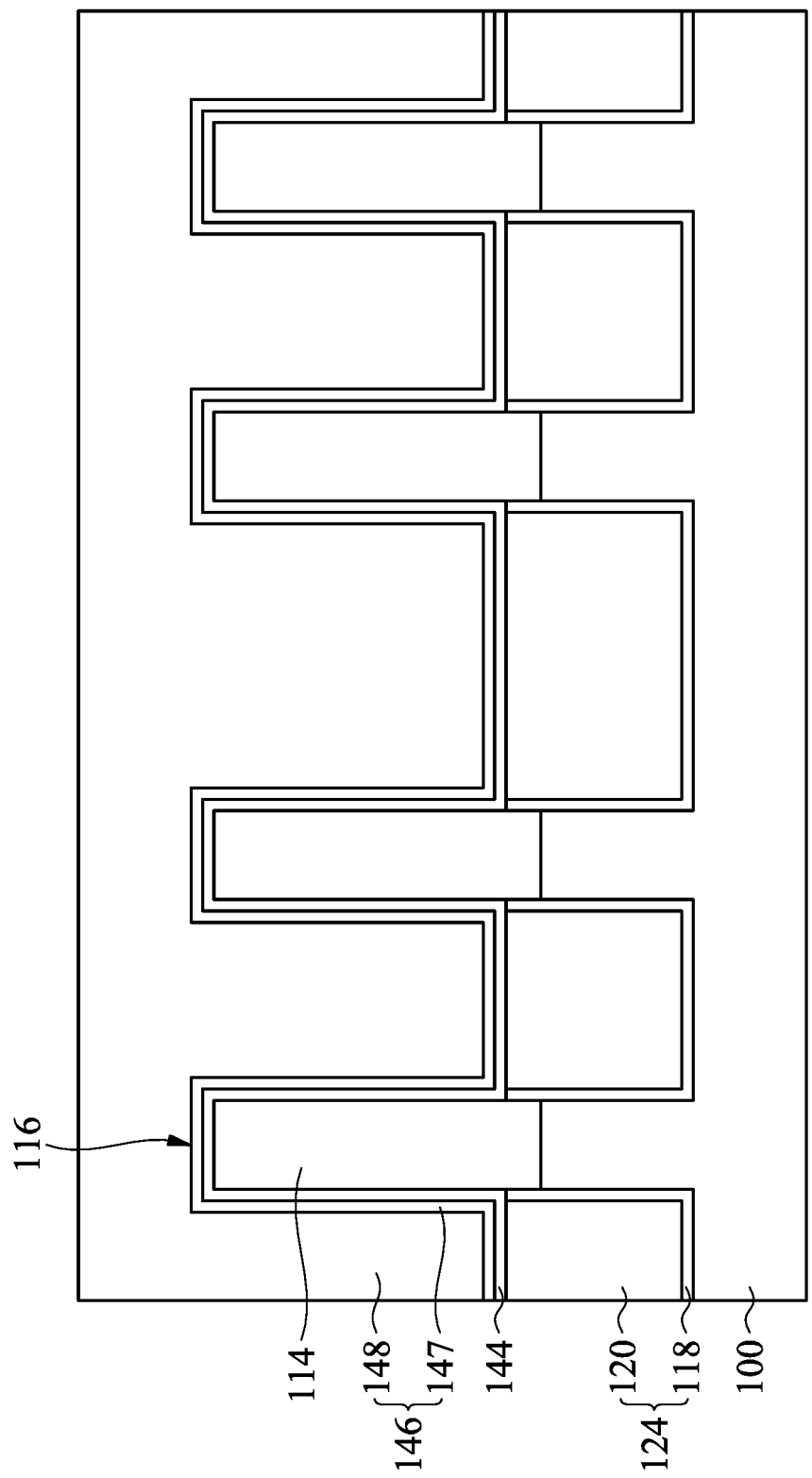
Figure 17B:
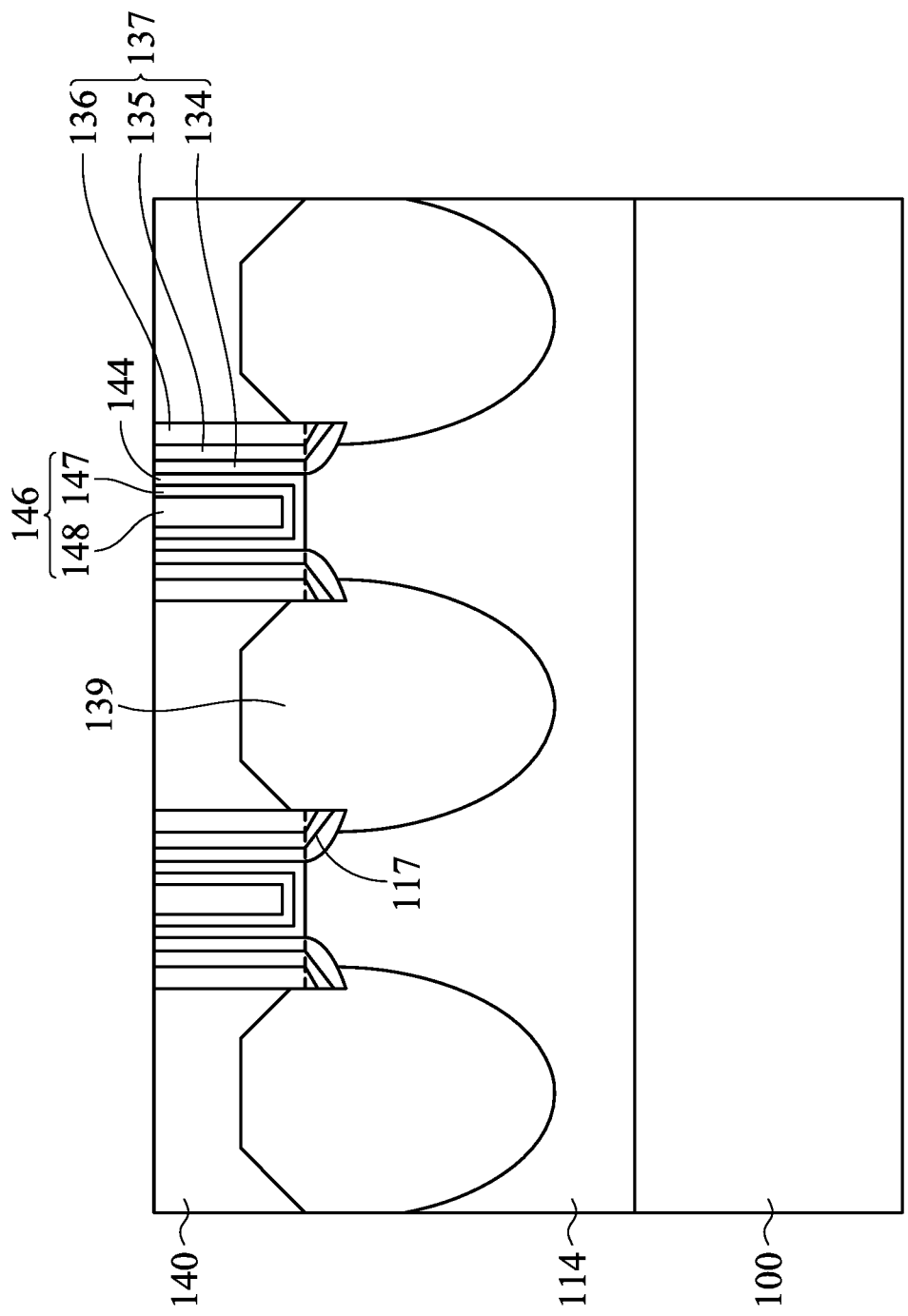

In FIGS. 17A and 17B, gate dielectric layers 144 and gate electrodes 146 are formed for replacement gates. The gate dielectric layers 144 are deposited conformally in the recesses 142, such as on the top surfaces and the sidewalls of the semiconductor fins 116 and on sidewalls of the gate spacers 137. The gate dielectric layers 144 may also be formed on the top surface of the first ILD 140. In accordance with some embodiments, the gate dielectric layers 144 comprise silicon oxide, silicon nitride, or multilayers thereof. In some embodiments, the gate dielectric layers 144 are a high-k dielectric material, and in these embodiments, the gate dielectric layers 144 may have a k value greater than about 7.0, and may include a metal oxide or a silicate of Hf, Al, Zr, La, Mg, Ba, Ti, Pb, and combinations thereof. The formation methods of the gate dielectric layers 144 may include molecular beam deposition (MBD), ALD, PECVD, and the like.

The gate electrodes 146 are deposited over the gate dielectric layers 144 and fill the remaining portions of the recesses 142. The gate electrodes 146 may be a metal-containing material such as TiN, TaN, TaC, Co, Ru, Al, combinations thereof, or multilayers thereof. The gate electrodes 146 may include one or more layers of conductive material, such as a work function layer 147 and a fill material 148. After the filling of the gate electrodes 146, a planarization process, such as a CMP, may be performed to remove the excess portions of the gate dielectric layers 144 and the gate electrodes 146, which excess portions are over the top surface of the first ILD 140. The remaining portions of the gate electrodes 146 and the gate dielectric layers 144 thus form replacement gates of the resulting FinFETs. The gate electrodes 146 and the gate dielectric layers 144 may be collectively referred to as a "gate structure" or a "gate stack." The gate structures and the gate stacks may extend along sidewalls of a channel region of the semiconductor fins 116.

Figure 18A:
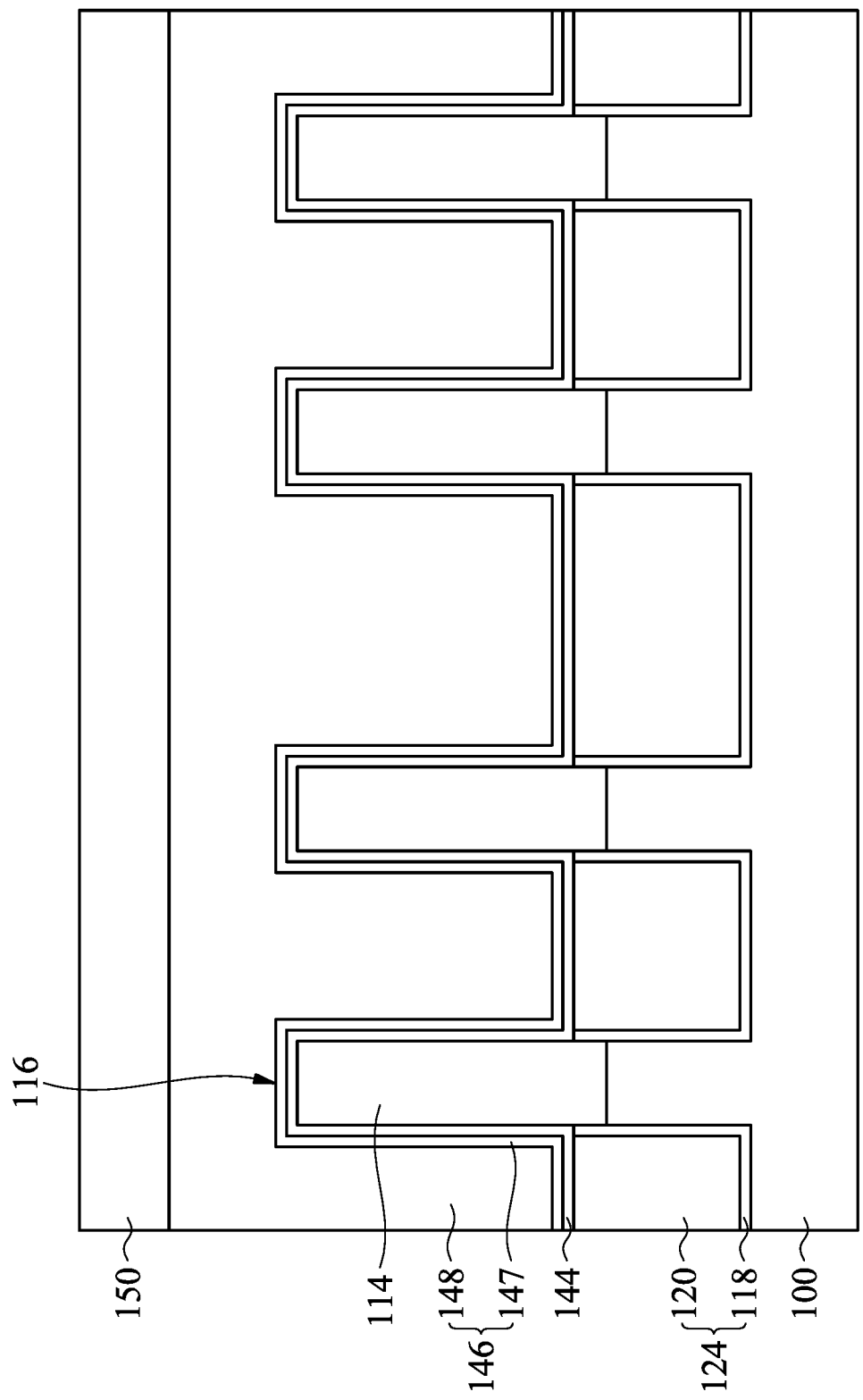
Figure 18B:
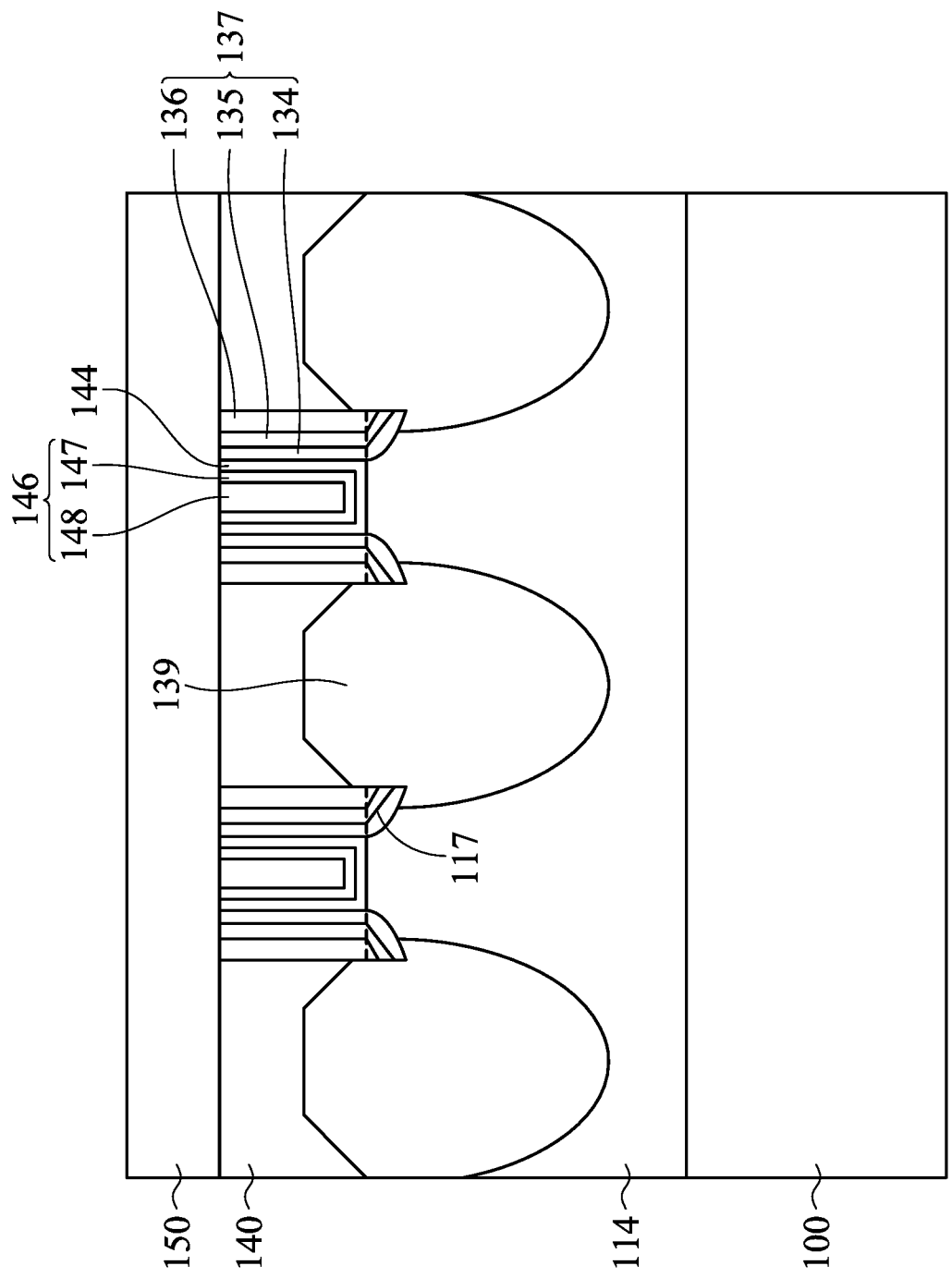

In FIGS. 18A and 18B, a second ILD 150 is deposited over the first ILD 140. In an embodiment, the second ILD 150 is a flowable film formed by a flowable CVD method. In some embodiments, the second ILD 150 is formed of a dielectric material such as PSG, BSG, BPSG, USG, or the like, and may be deposited by any suitable method, such as CVD and PECVD.

Figure 19A:
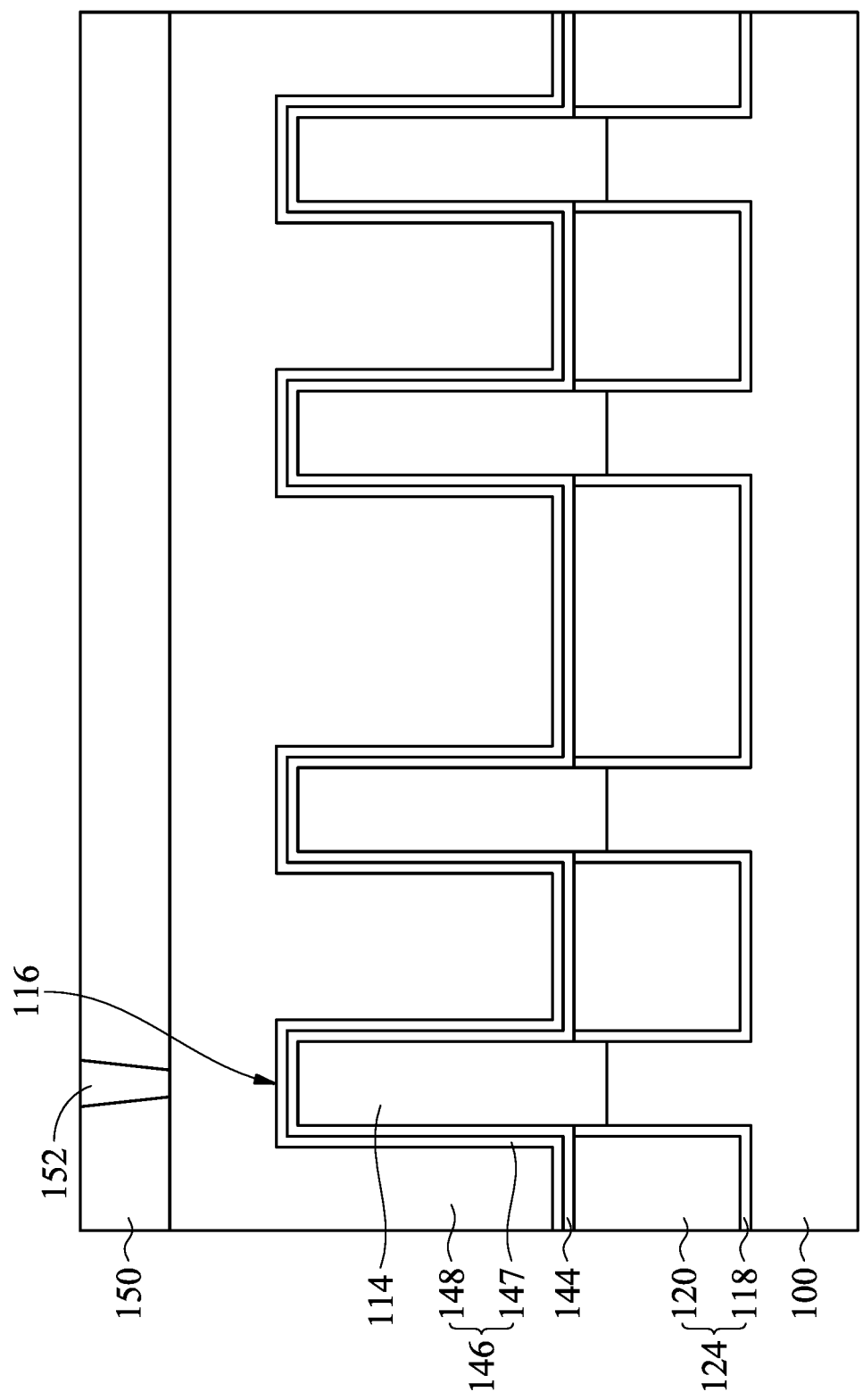
Figure 19B:
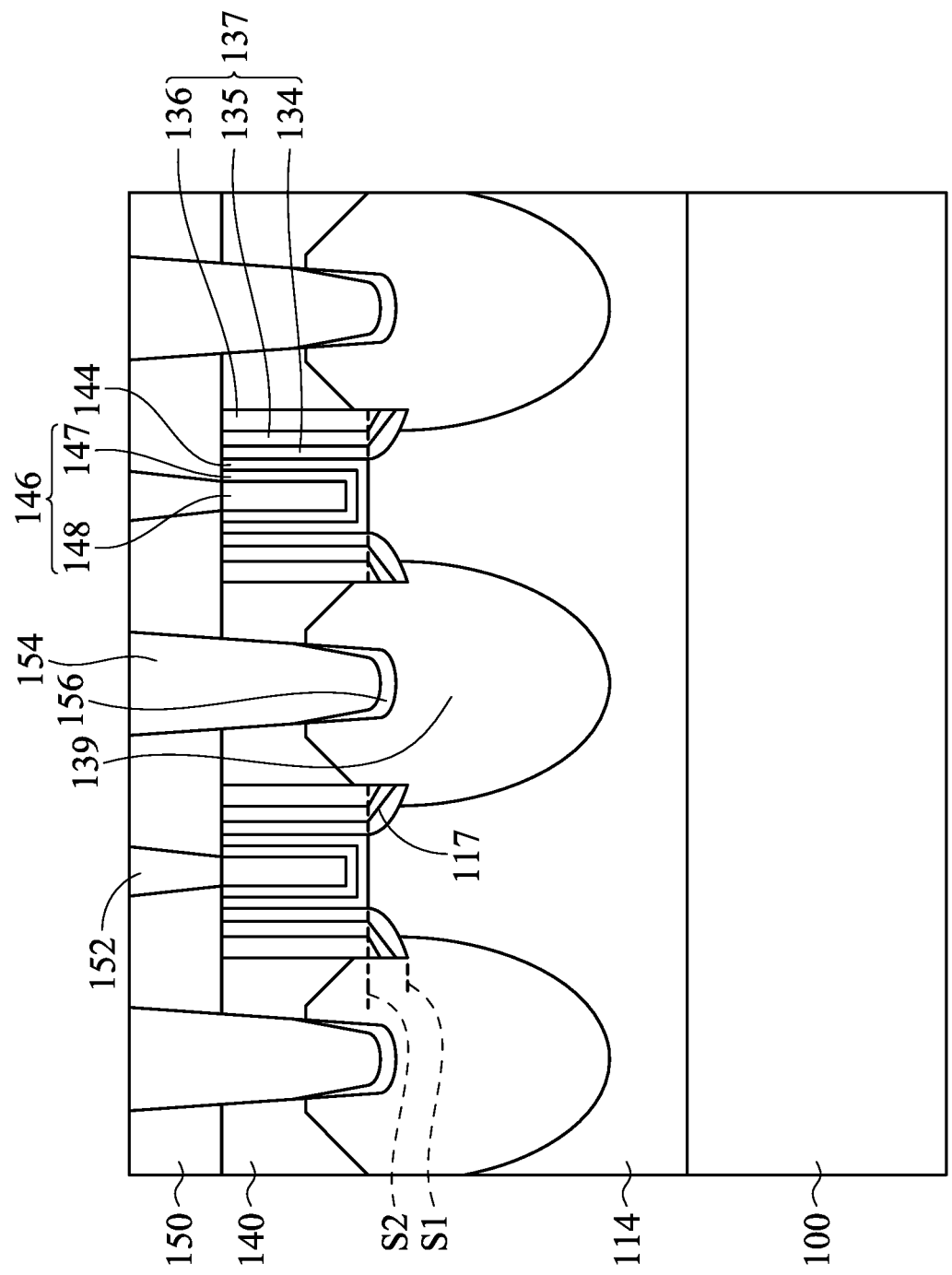

In FIGS. 19A and 19B, a gate contact 152 and source/drain contacts 154 are formed through the second ILD 150 and the first ILD 140. Openings for the source/drain contacts 154 are formed through the second ILD 150 and the first ILD 140, and openings for the gate contact 152 are formed through the second ILD 150. The openings may be formed using acceptable photolithography and etching techniques. In an embodiment, the openings may extend into the source/drain regions 139 to a depth such that the bottom surface of the openings is above or level with a bottom surface S1 of the triangular spacer extensions 117 and is below or level with a top surface S2 of the triangular spacer extensions, as illustrated in FIG. 19B. A liner, such as a diffusion barrier layer, an adhesion layer, or the like, and a conductive material may be formed in the openings. The liner may include titanium, titanium nitride, tantalum, tantalum nitride, or the like.

Optionally, prior to formation of the gate contact 152 and/or the source/drain contacts 154, a silicide contact 156 may be formed. The silicide contact 156 may comprise titanium, nickel, cobalt, or erbium, and may be used to reduce the Schottky barrier height of the gate contact 152 and/or the source/drain contacts 154. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. In an exemplary embodiment, silicide contact 156 is formed in the epitaxial source/drain region 139 such that it is disposed between triangular spacer extensions 117. In an embodiment, silicide contact 156 may be disposed in a U shape as illustrated in FIG. 19B, along a bottom surface and a lower portion of sidewalls of source/drain contact 154. In an embodiment, silicide contact 156 may have a thickness between a top and bottom surface of about 3 to about 15 nm and a width between opposite sidewalls between about 1 nm and about 10 nm.

The gate contact 152 and the source/drain contacts 154 may be formed of conductive materials such as Al, Cu, W, Co, Ti, Ta, Ru, TiN, TiAl, TiAlN, TaN, TaC, NiSi, CoSi, combinations of these, or the like, although any suitable material may be used. The material of the gate contact 152 and the source/drain contacts 154 may be deposited into the openings in the second ILD 150 and the first ILD 140 using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP). During the formation of the source/drain contacts 154, the triangular spacer extensions 117 will block unstable metal out-diffusion from the source/drain contacts 154. This reduction in unstable metal out-diffusion will reduce the source/drain area parasitic capacitance and improve the product reliability.

The gate contact 152 is physically and electrically connected to the fill material 148, and the source/drain contacts 154 are physically and electrically connected to the epitaxial source/drain regions 139. FIGS. 19A and 19B illustrate the gate contact 152 and the source/drain contacts 154 in a same cross-section; however, in other embodiments, the gate contact 152 and the source/drain contacts 154 may be disposed in different cross-sections. Further, the position of the gate contact 152 and the source/drain contacts 154 in FIGS. 19A and 19B are merely illustrative and not intended to be limiting in any way. For example, the gate contact 152 may be vertically aligned with one of the semiconductor fins 116 as illustrated or may be disposed at a different location on the fill material 148. Furthermore, the source/drain contacts 154 may be formed prior to, simultaneously with, or after forming the gate contacts 152.

As discussed above, mobile chips require lower power consumption in order to improve reliability. Lowering power consumption is dependent on reducing source/drain area parasitic capacitance. Unlike conventional structures wherein the low thermal stability of an interface between contact metal to source/drain epi may cause low yield and poor reliability, embodiments disclosed herein provide for faster device performance and improved yield and reliability due to the triangular spacer extensions acting as an out-diffusion metal blocking layer and reducing parasitic capacitance and power consumption. The process is compatible with the standard integrated flow fabrication without other loop processes being changed. At least some of the embodiments described herein can be extended to any process using epitaxial technology which requires shape change, such as MEMS devices, 3D IC devices and the like.

In an embodiment, a method of manufacturing a semiconductor device includes forming a first dummy gate and a second dummy gate over a semiconductor layer. The semiconductor layer is etched using the first dummy gate and the second dummy gate as a first mask. The etching forms a first recess in the semiconductor layer disposed between the first dummy gate and the second dummy gate. A first spacer is formed on sidewalls of the first dummy gate and a second spacer is formed on sidewalls of the second dummy gate. The first and second spacers form triangular spacer extensions contacting the bottom surface of the first recess. After forming the first spacer and the second spacer, a second recess is formed in the semiconductor layer disposed between the first dummy gate and the second dummy gate. A source/drain region is epitaxially grown in the second recess. In an embodiment, forming the second recess undercuts the triangular spacer extensions. In an embodiment, a contact is formed on the source/drain region. The contact extends to a depth above or level with a bottom surface of the triangular spacer extensions and below or level with a top surface of the triangular spacer extensions. In an embodiment, the second recess is formed with an anisotropic etch using the first spacer and the second spacer as a second mask. In an embodiment, the triangular spacer extensions are formed with a corner profile height between about 1 nm to about 10 nm and a corner profile width between about 1 nm to about 10 nm. In an embodiment, the triangular spacer extensions are formed with a ratio of the corner profile height to the corner profile width between about 0.1 to 1.0.

In accordance with another embodiment, a method of manufacturing a semiconductor device includes epitaxially growing a semiconductor layer on a substrate. A first gate is formed on the semiconductor layer. The semiconductor layer is etched using the first gate as a mask. The etching forms a first and second recess in the semiconductor layer adjacent the first gate. A spacer is formed on sidewalls of the first gate. The spacer forms triangular spacer extensions contacting the bottom surface of the first recess. A second recess is formed in the semiconductor layer using the spacer layer as a mask. A source/drain region is formed in the second recess. A contact is formed on the source/drain region. In an embodiment, the layer contains SiGe, and the germanium percentage of the SiGe is between about 10% to 50%. In an embodiment, the etching of the layer containing SiGe is along crystal planes of the SiGe. In an embodiment, the etching the semiconductor layer is a dry etch process. In an embodiment, the dry etch process is performed with $Cl_2$, HBr, or HF. In an embodiment, forming the spacer consists of forming a plurality of subspacers. In an embodiment, in order to form the contact, the source/drain region is etched to form a third recess to a depth level with a bottom surface of the triangular spacer extensions. In an embodiment, a portion of metal may be deposited in the third recess and annealed to form a silicide. In an embodiment, the contact is formed so that it has a bottom surface below a top surface of the triangular spacer extensions and above a bottom surface of the triangular spacer extensions.

In accordance with yet another embodiment, a device includes a substrate having a fin. A first gate extends from the fin. A source/drain region is disposed in the fin adjacent to the first gate. A contact is disposed on the source/drain region. A spacer is disposed along sidewalls of the first gate. The spacer forms triangular spacer extensions extending lower than an uppermost surface of the fin below the first gate. In an embodiment, the triangular spacer extensions have a height between about 1 nm and about 10 nm and a width between about 1 nm and about 10 nm. In an embodiment, the spacer consists of a plurality of subspacers. In an embodiment, a silicide region is level with the triangular spacer extensions and the contact sits directly on the silicide region. In an embodiment, the fin contains SiGe with a germanium percentage of about 10% to about 50%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first dummy gate and a second dummy gate over a semiconductor layer;
    etching the semiconductor layer using the first dummy gate and the second dummy gate as a first mask, wherein the etching forms a first recess in the semiconductor layer disposed between the first dummy gate and the second dummy gate;
    forming a first spacer on sidewalls of the first dummy gate and a second spacer on sidewalls of the second dummy gate, wherein the first spacer and the second spacer forms triangular spacer extensions contacting a bottom surface of the first recess;
    after forming the first spacer and the second spacer, forming a second recess in the semiconductor layer disposed between the first dummy gate and the second dummy gate; and
    forming a source/drain region in the second recess.

2. The method of claim 1, wherein forming the second recess undercuts the triangular spacer extensions.

3. The method of claim 1, further comprising forming a contact on the source/drain region, wherein the contact extends to a depth above or level with a bottom surface of the triangular spacer extensions and below or level with a top surface of the triangular spacer extensions.

4. The method of claim 1, wherein forming the second recess comprises anisotropically etching using the first spacer and the second spacer as a second mask.

5. The method of claim 1, wherein the triangular spacer extensions are formed with a corner profile height between about 1 nm to about 10 nm and a corner profile width between about 1 nm and about 10 nm.

6. The method of claim 5, wherein the triangular spacer extensions are formed with a ratio of the corner profile height to the corner profile width between about 0.1 and about 10.

7. A method of manufacturing a semiconductor device, the method comprising:
    epitaxially growing a semiconductor layer on a substrate;
    forming a first gate on the semiconductor layer;
    etching the semiconductor layer using the first gate as a mask, wherein the etching forms a first recess and a second recess in the semiconductor layer adjacent the first gate;

forming a spacer on sidewalls of the first gate, wherein the spacer forms triangular spacer extensions contacting a bottom surface of the first recess;

forming a second recess in the semiconductor layer using the spacer as a mask;

forming a source/drain region in the second recess; and forming a contact to the source/drain region.

8. The method of claim 7, wherein the semiconductor layer comprises SiGe, wherein a germanium percentage of the SiGe is between about 10% to about 50%.

9. The method of claim 8, wherein etching the semiconductor layer comprising etching along crystal planes of the SiGe.

10. The method of claim 7, wherein the etching the semiconductor layer comprises a dry etch process.

11. The method of claim 10, wherein the dry etch process is performed with $Cl_2$, HBr, or HF.

12. The method of claim 7, wherein forming the spacer comprises forming a plurality of subspacers.

13. The method of claim 7, wherein forming the contact on the source/drain region comprises etching the source/drain region to form a third recess to a depth level with a bottom surface of the triangular spacer extensions.

14. The method of claim 13, wherein forming the contact further comprises:

depositing a metal in the third recess; and annealing the metal to form a silicide.

15. The method of claim 7, wherein the contact has a bottom surface below a top surface of the triangular spacer extensions and above a bottom surface of the triangular spacer extensions.

16. A device, comprising:

a substrate having a fin;

a first gate on the fin;

a source/drain region in the fin adjacent to the first gate;

a silicide region on the source/drain region;

a contact directly on the silicide region; and a spacer along sidewalls of the first gate, the spacer comprising triangular spacer extensions extending lower than an uppermost surface of the fin below the first gate, wherein the silicide region is level with the triangular spacer extensions.

17. The device of claim 16, wherein the triangular spacer extensions have a height between about 1 nm and about 10 nm and a width between about 1 nm and about 10 nm.

18. The device of claim 16, wherein the spacer comprises a plurality of subspacers.

19. The device of claim 16, wherein the fin comprises SiGe, wherein a germanium percentage of the SiGe fin is about 10% to about 50%.

20. The device of claim 16, wherein the triangular spacer extensions extend over a portion of the source/drain region.

* * * * *